United States Patent
Biwa et al.

(10) Patent No.: US 11,158,767 B2
(45) Date of Patent: Oct. 26, 2021

(54) LIGHT-EMITTING ELEMENT, LIGHT-EMITTING UNIT, LIGHT-EMITTING PANEL DEVICE, AND METHOD FOR DRIVING LIGHT-EMITTING PANEL DEVICE

(71) Applicant: SONY SEMICONDUCTOR SOLUTIONS CORPORATION, Kanagawa (JP)

(72) Inventors: Goshi Biwa, Kanagawa (JP); Akira Ohmae, Kanagawa (JP); Yusuke Kataoka, Kanagawa (JP); Tatsuo Ohashi, Kanagawa (JP); Ippei Nishinaka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/559,874

(22) PCT Filed: Mar. 24, 2016

(86) PCT No.: PCT/JP2016/001713
§ 371 (c)(1),
(2) Date: Sep. 20, 2017

(87) PCT Pub. No.: WO2016/157850
PCT Pub. Date: Oct. 6, 2016

(65) Prior Publication Data
US 2018/0062047 A1   Mar. 1, 2018

(30) Foreign Application Priority Data
Mar. 30, 2015 (JP) .............................. JP2015-068902

(51) Int. Cl.
*H01L 27/15* (2006.01)
*H01L 33/36* (2010.01)
(Continued)

(52) U.S. Cl.
CPC .......... *H01L 33/486* (2013.01); *H01L 27/153* (2013.01); *H01L 33/0008* (2013.01);
(Continued)

(58) Field of Classification Search
CPC ......... H01L 33/46; H01L 33/38; H01L 33/62; H01L 33/486; H01L 33/0008;
(Continued)

(56) References Cited

U.S. PATENT DOCUMENTS 6,121,636 A * 9/2000 Morita .................... H01L 33/20
257/103
6,611,003 B1 * 8/2003 Hatakoshi ............... H01L 33/20
257/98

(Continued)

FOREIGN PATENT DOCUMENTS

CN   102655197 A   9/2012
CN   104347768 A   2/2015
(Continued)

OTHER PUBLICATIONS

International Search Report and Written Opinion of PCT Application No. PCT/JP2016/001713, dated Jun. 14, 2016, 13 pages of ISRWO.

*Primary Examiner* — Mary A Wilczewski
(74) *Attorney, Agent, or Firm* — Chip Law Group

(57) ABSTRACT

[Object] A light-emitting element includes: a semiconductor layer; a first electrode portion; a second electrode portion; a first insulating layer; and a metal layer. The semiconductor layer includes an active layer, a first-conductivity-type layer, and a second-conductivity-type layer, and has a semiconductor-layer side surface including a side surface of the active layer, a side surface of the first-conductivity-type layer, and a side surface of the second-conductivity-type layer. The first electrode portion is connected to the first-
(Continued)

conductivity-type layer. The second electrode portion is connected to the second-conductivity-type layer. The first insulating layer is in contact at least with a part of the semiconductor-layer side surface, the part of the semiconductor-layer side surface corresponding to a part of the side surface of the active layer. The metal layer is in contact at least with an opposed surface of the first insulating layer, the opposed surface of the first insulating layer facing the side surface of the active layer. The metal layer is conducted to the first electrode portion and insulated from the second electrode portion.

24 Claims, 16 Drawing Sheets

(51) Int. Cl.
*H01L 33/38* (2010.01)
*H01L 33/46* (2010.01)
*H01L 33/48* (2010.01)
*H01L 33/62* (2010.01)
*H05B 37/02* (2006.01)
*H05B 47/16* (2020.01)
*H01L 33/00* (2010.01)
*H01L 33/44* (2010.01)
*G09G 3/32* (2016.01)

(52) U.S. Cl.
CPC .............. *H01L 33/38* (2013.01); *H01L 33/46* (2013.01); *H01L 33/62* (2013.01); *H05B 47/16* (2020.01); *G09G 3/32* (2013.01); *G09G 2300/0426* (2013.01); *G09G 2310/08* (2013.01); *H01L 33/44* (2013.01)

(58) Field of Classification Search
CPC ....... H01L 27/153; H01L 33/44; H01L 33/36; H05B 37/0281; H05B 47/16; G09G 2300/0426; G09G 2310/08; G09G 3/32
See application file for complete search history.

(56) References Cited

U.S. PATENT DOCUMENTS

| | | | | |
|---|---|---|---|---|
| 7,622,746 B1* | 11/2009 | Lester | .............. | H01L 33/46 257/98 |
| 8,546,836 B2* | 10/2013 | Kamiya | .............. | H01L 33/20 257/99 |
| 8,686,447 B2* | 4/2014 | Tomoda | .............. | H01L 33/46 257/89 |
| 9,312,453 B2* | 4/2016 | Park | .............. | H01L 33/387 |
| 9,318,530 B2* | 4/2016 | Jang | .............. | H01L 27/156 |
| 9,343,644 B2* | 5/2016 | Chae | .............. | H01L 33/62 |
| 9,461,222 B1* | 10/2016 | Wei | .............. | H01L 33/62 |
| 9,543,484 B1* | 1/2017 | Endo | .............. | H01L 33/54 |
| 9,793,441 B2* | 10/2017 | Chae | .............. | H01L 33/405 |
| 9,831,401 B2* | 11/2017 | Chae | .............. | H01L 33/405 |
| 9,947,835 B2* | 4/2018 | Seo | .............. | H01L 33/44 |
| 9,960,206 B2* | 5/2018 | Saito | .............. | H01L 33/005 |
| 2003/0025212 A1* | 2/2003 | Bhat | .............. | H01L 33/20 257/780 |
| 2005/0211989 A1* | 9/2005 | Horio | .............. | H01L 33/40 257/79 |
| 2005/0274971 A1* | 12/2005 | Wang | .............. | H01L 33/46 257/100 |
| 2005/0279990 A1* | 12/2005 | Liu | .............. | H01L 33/38 257/13 |
| 2006/0108593 A1* | 5/2006 | Kim | .............. | H01L 33/46 257/94 |
| 2006/0145164 A1* | 7/2006 | Illek | .............. | H01L 33/405 257/79 |
| 2009/0039374 A1* | 2/2009 | Yahata | .............. | H01L 33/387 257/98 |
| 2009/0173952 A1* | 7/2009 | Takeuchi | .............. | H01L 33/0079 257/79 |
| 2009/0246899 A1* | 10/2009 | Fan | .............. | H01L 33/46 438/27 |
| 2011/0186953 A1* | 8/2011 | Plo I | .............. | H01L 33/0079 257/432 |
| 2011/0254039 A1* | 10/2011 | Kim | .............. | H01L 33/46 257/98 |
| 2011/0284822 A1* | 11/2011 | Jung | .............. | H01L 33/505 257/13 |
| 2012/0049219 A1* | 3/2012 | Kamiya | .............. | H01L 33/382 257/98 |
| 2012/0070920 A1* | 3/2012 | Shimonishi | .............. | H01L 33/005 438/26 |
| 2012/0146045 A1* | 6/2012 | Sugiyama | .............. | H01L 33/06 257/76 |
| 2012/0223345 A1 | 9/2012 | Tomoda et al. | | |
| 2014/0159089 A1* | 6/2014 | Lee | .............. | H01L 33/382 257/98 |
| 2014/0361321 A1* | 12/2014 | Saito | .............. | H01L 33/005 257/89 |
| 2015/0041836 A1* | 2/2015 | Saito | .............. | H01L 33/46 257/89 |
| 2015/0108525 A1* | 4/2015 | Chae | .............. | H01L 33/38 257/98 |
| 2017/0133554 A1* | 5/2017 | Okuyama | .............. | H01L 33/0062 |
| 2017/0294418 A1* | 10/2017 | Edmond | .............. | H01L 25/0753 |
| 2018/0062047 A1* | 3/2018 | Biwa | .............. | H01L 33/00 |
| 2021/0074885 A1* | 3/2021 | Nakamura | .............. | H01L 25/0753 |

FOREIGN PATENT DOCUMENTS

| | | | | |
|---|---|---|---|---|
| EP | 2495761 A2 | 9/2012 | | |
| JP | 08-102549 A | 4/1996 | | |
| JP | 8-102549 A | 4/1996 | | |
| JP | 11-340514 A | 12/1999 | | |
| JP | 2012-182276 A | 9/2012 | | |
| JP | 2015-032809 A | 2/2015 | | |
| JP | 2015-32809 A | 2/2015 | | |
| KR | 10-2012-0099585 A | 9/2012 | | |
| TW | 201304186 A | 1/2013 | | |
| WO | WO 2015/194095 | * 12/2015 | .............. | H01L 33/20 |
| WO | WO2020/080153 | * 4/2020 | .............. | H01L 33/36 |

* cited by examiner

LIGHT-EMITTING ELEMENT, LIGHT-EMITTING UNIT, LIGHT-EMITTING PANEL DEVICE, AND METHOD FOR DRIVING LIGHT-EMITTING PANEL DEVICE

CROSS REFERENCE TO RELATED APPLICATIONS

This application is a U.S. National Phase of International Patent Application No. PCT/JP2016/001713 filed on Mar. 24, 2016, which claims priority benefit of Japanese Patent Application No. JP 2015-068902 filed in the Japan Patent Office on Mar. 30, 2015. Each of the above-referenced applications is hereby incorporated herein by reference in its entirety.

TECHNICAL FIELD

The present technology relates to a light-emitting element that uses a solid-state light source made, for example, of a semiconductor material, a light-emitting unit, a light-emitting panel device including the light-emitting unit, and a method for driving the light-emitting panel device.

BACKGROUND ART

In recent years, LED displays that use light-emitting diodes (LEDs) as display pixels have been spotlighted as lightweight and thin display devices. The LED displays are featured in that there is no viewing angle dependence, that is, no changes in contrast and color tone in accordance with viewing angles, and in that responses at the time of changing colors are quick. Light-emitting elements suited to use in such LED displays are disclosed, for example, in Patent Literature 1.

The light-emitting elements described in Patent Literature 1 are arranged in a light-emitting unit, and each include a semiconductor layer formed by laminating, for example, an active layer, a first-conductivity-type layer connected to a first electrode, a second-conductivity-type layer connected to a second electrode. Further, the light-emitting elements each include a first insulating layer in contact at least with a part of a surface of the semiconductor layer, the part corresponding to a side surface (end surface) of the active layer, and a metal layer arranged on an outside of the first insulating layer and configured to block or reflect light emitted from the active layer. This metal layer is electrically separated and insulated from the first electrode and the second electrode (refer, for example, to paragraph [0029] of the specification and FIG. 2 of Patent Literature 1).

CITATION LIST

Patent Literature

Patent Literature 1: Japanese Patent Application Laid-open No. 2012-182276

DISCLOSURE OF INVENTION

Technical Problem

However, in the above-described light-emitting elements, the metal layer is separated from the first electrode and the second electrode, and insulation therebetween needs to be securely effected. Thus, formation positions of the metal layer and the electrodes need to be set with high accuracy.

In view of such circumstances, the present technology has been made to achieve an object to provide a light-emitting element including a metal layer and an electrode that can be formed with relatively low positional accuracy, a light-emitting unit, and a light-emitting panel device, and an object to provide a method for driving the light-emitting panel device.

Solution to Problem

In order to achieve the above-mentioned objects, according to the present technology, there is provided a light-emitting element including: a semiconductor layer; a first electrode portion; a second electrode portion; a first insulating layer; and a metal layer.

The semiconductor layer includes
   an active layer,
   a first-conductivity-type layer, and
   a second-conductivity-type layer, and has a semiconductor-layer side surface including
     a side surface of the active layer,
     a side surface of the first-conductivity-type layer, and
     a side surface of the second-conductivity-type layer.

The first electrode portion is connected to the first-conductivity-type layer.

The second electrode portion is connected to the second-conductivity-type layer.

The first insulating layer is in contact at least with a part of the semiconductor-layer side surface, the part of the semiconductor-layer side surface corresponding to a part of the side surface of the active layer.

The metal layer is in contact at least with an opposed surface of the first insulating layer, the opposed surface of the first insulating layer facing the side surface of the active layer. The metal layer is conducted to the first electrode portion and insulated from the second electrode portion.

The metal layer is conducted to the first electrode portion, and hence the metal layer and the first electrode portion can be formed with positional accuracy lower than that in a case where the metal layer is insulated from both the first electrode portion and the second electrode portion.

The first insulating layer and the metal layer may have a laminated structure, and cover an entirety of the semiconductor-layer side surface.

With this, light leakage can be reliably suppressed.

The second-conductivity-type layer may have
   a first surface which is in contact with the active layer, and
   a second surface which is on an opposite side with respect to the first surface, and to which the second electrode portion is connected, the second surface serving as a light-emitting surface.

The first electrode portion may include a first connecting-conductive portion that can be connected to a substrate, the light-emitting element being mounted to the substrate.

The metal layer may be connected to the first connecting-conductive portion.

With this, the light leakage to the substrate side can be reliably prevented, and hence, for example, a resin material can be prevented from being deteriorated. Further, efficiency in emitting light through the light-emitting surface can be increased.

The second electrode portion may include a second connecting-conductive portion formed through the first insulating layer.

The metal layer may be connected to the second connecting-conductive portion.

With this, a light-emitting element of a one-side-electrode type can be obtained.

The first-conductivity-type layer may have a first surface which is in contact with the active layer, and a second surface which is on the opposite side with respect to the first surface, and to which the first electrode portion is connected, the second surface serving as the light-emitting surface.

The first electrode portion may be connected to the metal layer across an end surface on the light-emitting surface side of the first insulating layer.

The first electrode portion may include the first connecting-conductive portion formed through the first insulating layer.

The metal layer may be connected to the first connecting-conductive portion.

With this, the light-emitting element of the one-side-electrode type can be obtained.

The light-emitting element may further include a second insulating layer formed such that the metal layer is arranged between the first insulating layer and the second insulating layer.

The first-conductivity-type layer may be a p-type semiconductor layer, and the second-conductivity-type layer may be an n-type semiconductor layer. Alternatively, reversely, the first-conductivity-type layer may be the n-type semiconductor layer, and the second-conductivity-type layer may be the p-type semiconductor layer.

Those semiconductor layers may be made of a gallium-nitride compound semiconductor or a phosphide-compound semiconductor.

The light-emitting element may further include a third electrode portion for external connection, the third electrode portion being connected to the metal layer.

With this, an area of the first electrode portion can be reduced as much as possible. Further, when the third electrode portion is arranged, for example, at a part other than that on the second surface, the light-emitting efficiency can be increased.

This light-emitting element may further include the second insulating layer formed such that the metal layer is arranged between the first insulating layer and the second insulating layer.

The metal layer may have an opening.

The second insulating layer may have a first opening facing the opening of the metal layer, and a second opening.

The second electrode portion may be arranged on the second insulating layer so as to be in contact with the second-conductivity-type layer through the opening of the metal layer and the first opening.

The third electrode portion may be arranged on the second insulating layer so as to be in contact with the metal layer through the second opening.

The second electrode portion and the third electrode portion may be configured such that a part of the second electrode portion and a part of the third electrode portion are located in a common plane on the second insulating layer.

With this, for example, a light-emitting element of a flip-chip type can be obtained.

The first electrode portion may include a transparent electrode.

The second insulating layer may have an outer-peripheral side surface forming a side surface of the light-emitting element.

The first electrode portion may have an exposed side surface, and a contour of the exposed side surface may conform to a contour of a part of the outer-peripheral side surface of the second insulating layer.

With this, a manufacturing step is simplified.

The light-emitting element may further include a protective layer that covers the first-conductivity-type layer.

The second insulating layer may have the outer-peripheral side surface forming the side surface of the light-emitting element.

An outer peripheral portion of the first electrode portion may be arranged on an inner side with respect to the outer-peripheral side surface of the second insulating layer, and covered with the protective layer.

With this, even when the first electrode portion is made of a corrosion-prone material, corrosion thereof can be suppressed.

The light-emitting element may further include a protective layer including an uncovered region in which a part of the metal layer and a part of the first-conductivity-type layer are not continuously covered, the protective layer being formed on the first-conductivity-type layer.

The first electrode portion may be arranged in the uncovered region of the protective layer.

With this, a the first electrode portion can be formed, for example, by plating growth from the metal layer.

According to the present technology, there is provided a light-emitting unit including: a substrate including a wire; a light-emitting element; and a joint portion that joins the light-emitting element to the wire on the substrate.

The light-emitting element includes the semiconductor layer, the first electrode portion, the second electrode portion, the first insulating layer, and the metal electrode described above.

Incidentally, depending, for example, on a metal material to be used for the substrate, the light-emitting element being mounted to the substrate, there may be a risk of ion migration from the metal material to the metal layer. The ion migration may cause short-circuiting and leakage current. For example, the joint portion or the wire is made of silver, copper, lead, tin, gold, nickel, palladium, or an alloy of at least two of these metals. With this, even with use of these materials that are liable to cause the ion migration, the ion migration can be prevented. As a result, short-circuiting and leakage current between the joint portion or the wire and the metal layer can be prevented.

According to the present technology, there is provided a light-emitting panel device including: a light-emitting panel; and a drive circuit.

The light-emitting panel includes a plurality of light-emitting elements.

The drive circuit drives the plurality of light-emitting elements.

The plurality of light-emitting elements include at least one light-emitting element including the semiconductor layer, the first electrode portion, the second electrode portion, the first insulating layer, and the metal layer described above.

The metal layer is conducted to the first electrode portion, and hence the metal layer and the first electrode portion are formed with relatively low positional accuracy. As a result, manufacture of the light-emitting panel is facilitated.

The light-emitting panel device may further include the substrate, the plurality of light-emitting elements being arranged in matrix on the substrate.

The drive circuit may be configured to apply a positive voltage to the first electrode portion to cause the light-emitting elements to emit light.

The drive circuit may be configured to control timings of applying the positive voltage such that the positive voltage is applied alternately to the first electrode portion and the second electrode portion, and that a period for applying the positive voltage to the first electrode portion is longer than a period for applying the positive voltage to the second electrode portion.

In other words, when the voltage-application period for the electrode (first electrode portion) to which the positive voltage is applied is set long, a period and frequency of occurrence of the ion migration to the metal layer conducted to the electrode (first electrode portion) can be suppressed to be smaller than those in a case where the voltage-application period is short. With this, reliability of products is increased.

The first-conductivity-type layer may be the n-type semiconductor layer, and the second-conductivity-type layer may be the p-type semiconductor layer.

Further, the drive circuit may be configured to apply the positive voltage to a first electrode during a non-light-emission period, and to apply the positive voltage to the second electrode portion during a light-emission period.

With this, a light-emitting panel device that uses a passive matrix system can be obtained.

According to the present technology, there is provided a method for driving the light-emitting panel device, the method including causing the drive circuit to execute the steps of:

applying the positive voltage to the first electrode portion;

applying the positive voltage to the second electrode portion; and controlling the timings of applying the voltage such that the voltage is applied alternately to the first electrode portion and the second electrode portion, and that the period for applying the voltage to the first electrode portion is longer than the period for applying the voltage to the second electrode portion.

The light-emitting panel may include the substrate, the plurality of light-emitting elements being arranged in matrix on the substrate.

The first-conductivity-type layer may be the n-type semiconductor layer, and the second-conductivity-type layer may be the p-type semiconductor layer.

Further, the drive circuit may be caused to apply the positive voltage to the first electrode portion during the non-light-emission period, and to apply the positive voltage to the second electrode portion during the light-emission period.

Advantageous Effects of Invention

As described hereinabove, according to the present technology, a metal layer or an electrode can be formed with relatively low positional accuracy.

Note that, the advantages disclosed herein are not necessarily limited to those described hereinabove, and all of the advantages disclosed herein may be obtained.

MODES FOR CARRYING OUT THE INVENTION

Figure 1A:
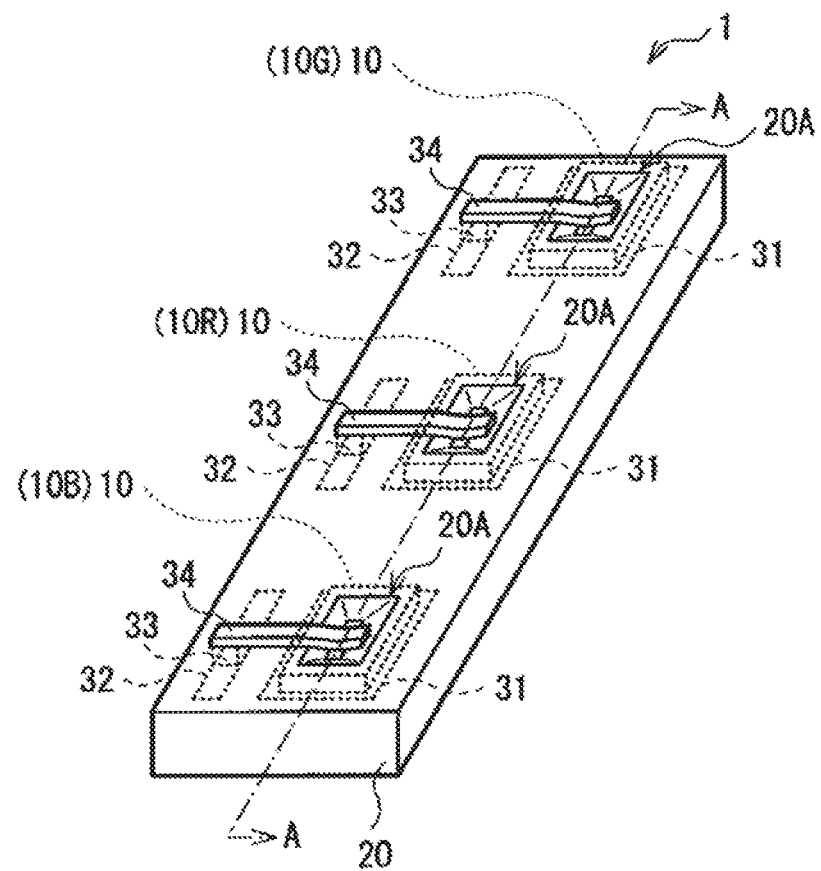
FIG. 1A is a perspective view illustrating an example of a schematic configuration of a light-emitting unit according to the present technology.

Now, embodiments of the present technology are described with reference to the drawings.

In the following description, when referring to the drawings, words such as "upper, lower, left, right, vertical, and horizontal" may be used to indicate directions and positions of elements and devices merely for the sake of convenience of description. In other words, these words are used mainly for the sake of better understanding of the description, and hence may not correspond to directions and positions in situations where the elements and the devices are actually manufactured or used.

1. Embodiment 1

1.1) Configuration of Light-Emitting Unit

Figure 1B:
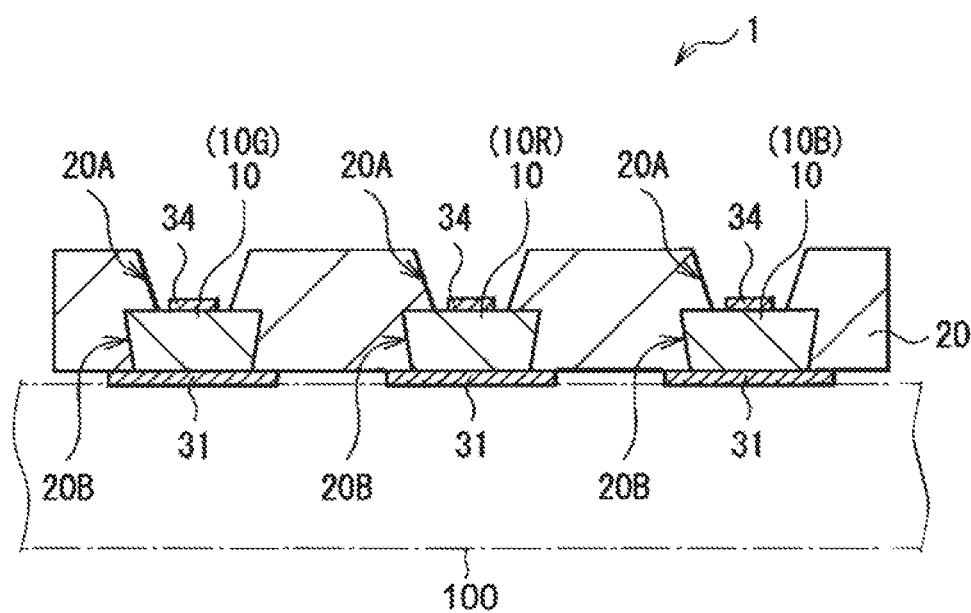
FIG. 1B illustrates an example of a cross-sectional configuration of the light-emitting unit 1, which is taken along the direction of the arrows A-A in FIG. 1A.

FIG. 1A is a perspective view illustrating an example of a schematic configuration of a light-emitting unit 1. FIG. 1B illustrates an example of a cross-sectional configuration of the light-emitting unit 1, which is taken along the direction of the arrows A-A in FIG. 1A. The light-emitting unit 1 is a fine package obtained by covering a plurality of light-emitting elements with a thin resin, and is suitably applicable as a display pixel of a display device called an LED display.

As illustrated in FIG. 1A, the light-emitting unit 1 includes three light-emitting elements 10. The light-emitting elements 10 are each a solid-state light-emitting element that emits light in a predetermined wavelength band through its upper surface, specifically, are each an LED chip. The LED chip herein refers to a chip in a state of being cut out of a wafer used for crystal growth, and hence is not a chip of a package type covered, for example, with a molded resin.

The LED chip has a size of, for example, 5 µm or more and 100 mm or less. The LED chip has, for example, substantially a square shape in plan view. The LED chip is formed into a thin piece. The LED chip has as aspect ratio (height/width) set, for example, to 0.1 or more and less than 1. However, this aspect ratio is not limited thereto, and may be set, for example, to 0.001 or more and less than 10.

The light-emitting elements 10 are arranged in the light-emitting unit 1. As illustrated in FIG. 1A, the light-emitting elements 10 are arranged, for example, in a line at predetermined intervals with respect to other ones of the light-emitting elements 10. In this case, the light-emitting unit 1 has, for example, an elongated shape extending in an array direction of the light-emitting elements 10. The gap between adjacent two of the light-emitting elements 10 is set, for example, equivalent to or larger than the size of each of the light-emitting elements 10. Note that, when necessary, the gap may be set smaller than the size of each of the light-emitting elements 10.

The light-emitting elements 10 are configured to emit respective light beams in wavelength bands different from each other. For example, as illustrated in FIG. 1A, the three light-emitting elements 10 includes a light-emitting element 10G that emits a light beam in a green wavelength band, a light-emitting element 10R that emits a light beam in a red wavelength band, and a light-emitting element 10B that emits a light beam in a blue wavelength band.

Note that, although respective positions of the light-emitting elements 10R, 10G, and 10B are not limited to those illustrated in FIGS. 1A and 1B, in the following, description of positional relationships between other components may be made on a premise that the light-emitting elements 10R, 10G, and 10B are arranged at those exemplified positions.

1.2) Configuration of Light-Emitting Element

Figure 2:
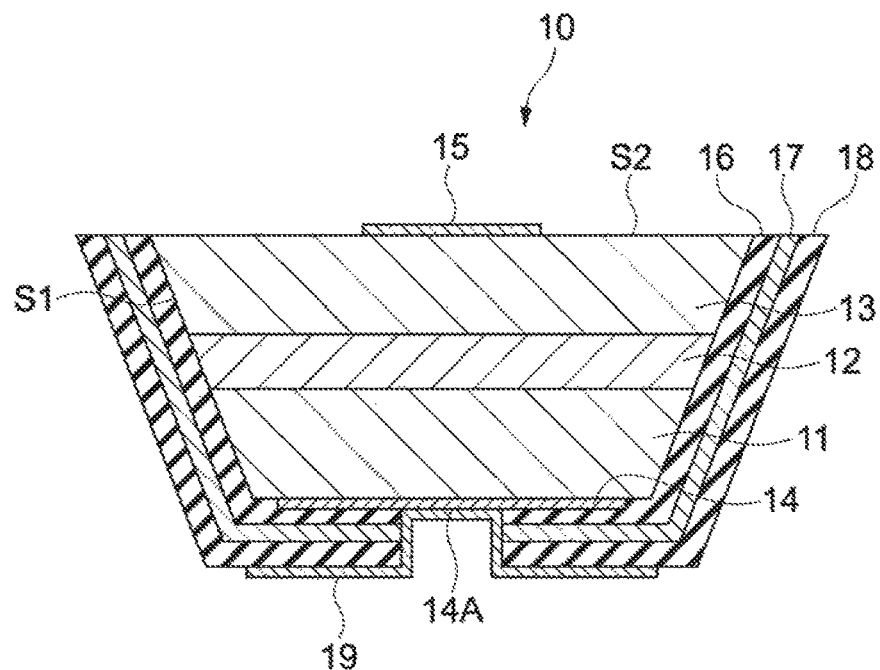
FIG. 2 is a cross-sectional view of a light-emitting element according to Embodiment 1 of the present technology.

For example, as illustrated in FIG. 2, the light-emitting elements 10 each include a semiconductor layer formed by laminating a first-conductivity-type layer 11, an active layer 12, and a second-conductivity-type layer 13 in this order from below. The semiconductor layer may include a layer other than these layers.

In each of the light-emitting elements 10G and 10B, the first-conductivity-type layer 11, the active layer 12, and the second-conductivity-type layer 13 are each made, for example, of a gallium-nitride compound semiconductor such as an InGaN semiconductor. Meanwhile, in the light-emitting element 10R, the first-conductivity-type layer 11, the active layer 12, and the second-conductivity-type layer 13 are each made, for example, of a phosphide-compound semiconductor such as an AlGaInP semiconductor.

A second electrode 15 is arranged on an upper surface of the second-conductivity-type layer 13 (that is, light-emitting surface S2). In each of the light-emitting elements 10G and 10B, the second electrode 15 is made, for example, of Ti/Pt/Au. In the light-emitting element 10R, the second electrode 15 is made, for example, of AuGe (alloy of gold and germanium)/Ni/Au. The second electrode 15 is in contact with the second-conductivity-type layer 13, and is electrically connected to the second-conductivity-type layer 13. In other words, the second electrode 15 is in ohmic contact with the second-conductivity-type layer 13.

A first electrode 14 is arranged under a lower surface of the first-conductivity-type layer 11. The first electrode 14 is a metal electrode. In each of the light-emitting elements 10G and 10B, the first electrode 14 is made, for example, of Ti/Pt/Au. In the light-emitting element 10R, the first electrode 14 is made, for example, of AuGe/Ni/Au. The first electrode 14 is in contact with the first-conductivity-type layer 11, and is electrically connected to the first-conductivity-type layer 11. In other words, the first electrode 14 is in ohmic contact with the first-conductivity-type layer 11.

The first electrode 14 and the second electrode 15 may each include a single electrode, or may include a plurality of electrodes.

Side surfaces S1 of the semiconductor layer (hereinafter, referred to as semiconductor-layer side surfaces) each include side surfaces of the first-conductivity-type layer 11, the active layer 12, and the second-conductivity-type layer 13. As illustrated in FIG. 2, for example, the semiconductor-layer side surfaces S1 are inclined surfaces intersecting with a laminating direction, more specifically, inclined surfaces that form the light-emitting element 10 into an inverse trapezoidal shape (inverse mesa shape) in cross-section. When the semiconductor-layer side surfaces S1 form a tapered shape in this way, light-emitting efficiency in a front direction can be increased. Note that, the semiconductor-layer side surfaces S1 may be, for example, surfaces along the laminating direction, that is, surfaces substantially parallel to the laminating direction.

As illustrated in FIG. 2, the light-emitting elements 10 each include a laminated body including a first insulating layer 16, a metal layer 17, a second insulating layer 18, and a pad electrode 19. The metal layer 17 is arranged between the first insulating layer 16 and the second insulating layer 18.

These layers of this laminated body are formed entirely from the semiconductor-layer side surfaces S1 to a lower surface (surface on a substrate 100 side) of the semiconductor layer. In this laminated body, at least the first insulating layer 16, the metal layer 17, and the second insulating layer 18 are each a thin layer formed, for example, by a thin-film forming process such as chemical vapor deposition (CVD), vapor deposition, and sputtering. In other words, in this laminated body, at least the first insulating layer 16, the metal layer 17, and the second insulating layer 18 are not formed by a thick-film forming process such as spin coating, or by resin molding or potting.

The first insulating layer 16, the metal layer 17, and the second insulating layer 18 at least cover entireties of the semiconductor-layer side surfaces S1. These layers 16, 17, and 18 are formed entirely from the semiconductor-layer side surfaces S1 to a part of the first electrode 14. The first insulating layer 16 has a function to electrically insulate the semiconductor layer.

The first insulating layer 16 is formed, along the semiconductor-layer side surfaces S1, entirely from an end portion on the light-emitting surface S2 side of the light-emitting element 10 to outer edges of a surface of the first electrode 14. In other words, the first insulating layer 16 is formed in contact not only with the entireties of the semiconductor-layer side surfaces S1 of the light-emitting element 10, but also with the outer edges of the surface of the first electrode 14.

The first insulating layer 16 is made of a transparent material that allows the light emitted from the active layer 12 to be transmitted therethrough, such as $SiO_2$, SiN, $Al_2O_3$, $TiO_2$, and TiN. The first insulating layer 16 has a substantially uniform thickness of, for example, from approximately 0.1 μm to 1 μm. Note that, the thickness of the first insulating layer 16 may be non-uniform within manufacturing tolerances.

The metal layer 17 has a function to block or reflect the light emitted from the active layer 12. The metal layer 17 is formed in contact with a surface of the first insulating layer 16. The metal layer 17 is formed, along the surface of the first insulating layer 16, entirely from an end portion on the light-emitting surface S2 side to a vicinity of a lower portion of the first electrode 14. In other words, the metal layer 17 is formed to cover an entirety of the first insulating layer 16.

For example, the end portion on the light-emitting surface S2 of the metal layer 17 is formed to be flush with an end portion on the light-emitting surface S2 side of the first insulating layer 16 (in other words, flush with the light-emitting surface S2). With this configuration, the end portion of the metal layer 17 is electrically insulated from the second electrode 15. Another end portion of the metal layer 17 is connected to the pad electrode 19. With this configuration, the metal layer 17 is electrically conducted to the first electrode 14.

The metal layer 17 is made of a material that blocks or reflects the light emitted from the active layer 12, such as Ti, Al, Cu, Au, Ni, Pt, W, Rh, Ru, and Pd, or an alloy of at least two of these metals. The metal layer 17 has a substantially uniform thickness of, for example, from approximately 0.1 μm to 1 μm. Note that, the thickness of the metal layer 17 may be non-uniform within manufacturing tolerances.

The second insulating layer 18 is arranged to cover an entirety of the metal layer 17, and has a function to protect the metal layer 17. However, in this embodiment, the second insulating layer 18 may be omitted, and the metal layer 17 may serve as an outermost peripheral layer of the light-emitting element 10.

As a material for the second insulating layer 18, the same material as that for the first insulating layer 16 may be used. The second insulating layer 18 has a substantially uniform thickness of, for example, from approximately 0.1 μm to 1 μm. Note that, the thickness of the second insulating layer 18 may be non-uniform within manufacturing tolerances.

The pad electrode 19 is an electrode that is connected to the first electrode 14 and drawn out of the first electrode 14. The pad electrode 19 herein functions as a "connecting conductive portion (first connecting-conductive portion)." The pad electrode 19 is formed entirely from a connecting lower surface 14A of the first electrode 14 to a lower surface of the second insulating layer 18. The pad electrode 19 is made of a material that reflects the light emitted from the active layer 12, such as Ti, Al, Cu, Au, and Ni, or an alloy of at least two of these metals.

In the following, a conductive portion including at least the first electrode 14 may sometimes be referred to as a "first electrode portion." This first electrode portion may include the connecting conductive portion including the pad electrode 19.

1.3) Comparison to Comparative Examples 1.3.1) Comparative Example 1

Figure 4A:
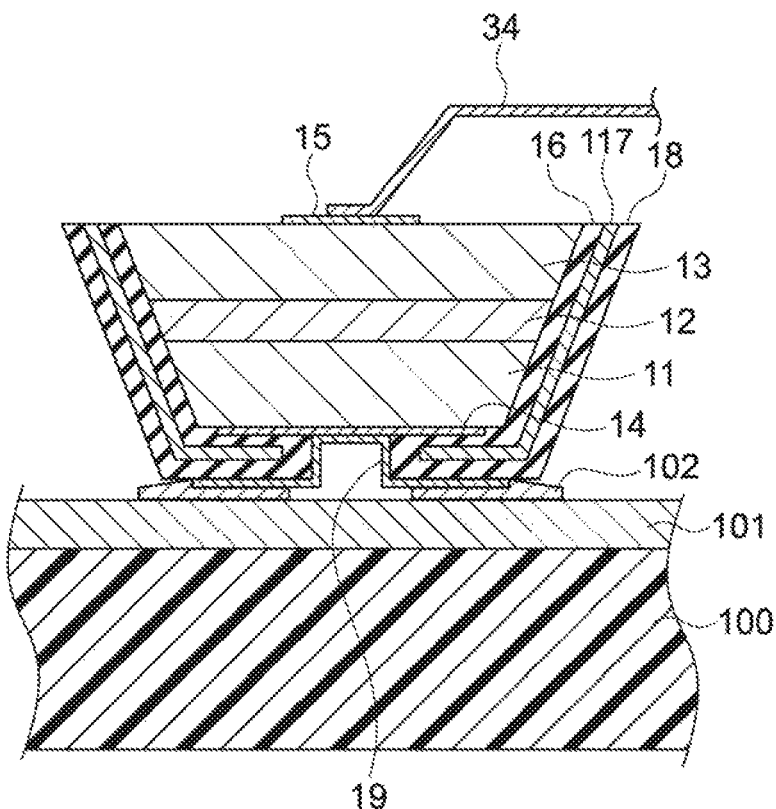
FIG. 4A is a cross-sectional view of a light-emitting element according to Comparative Example 1.

Next, FIG. 4A is a cross-sectional view of a light-emitting element according to Comparative Example 1. In the light-emitting element according to Comparative Example 1, a metal layer 117 is not conducted to the first electrode 14 (not connected to pad electrode 19), or not conducted to the second electrode 15. In other words, the metal layer 117 is insulated from both the electrodes 14 and 15. In such a configuration, in order that the metal layer 117 and the first electrode 14 are reliably insulated from each other, formation positions thereof need to be set with high accuracy.

In particular, in the light-emitting element according to Comparative Example 1, in plan view of the light-emitting element from the light-emitting surface S2 side, the metal layer 117 and the first electrode 14 need to be accurately overlapped with each other so as to suppress light leakage. The light leakage refers to a phenomenon that the light generated from the active layer leaks to the substrate 100 side without being reflected by the metal layer 117. There is a disadvantage in that high-accuracy exposure device and inspection device are needed for controlling the overlapping accuracy. In addition, even when the overlapping accuracy is kept high, propagation of the light through the insulating layers cannot be perfectly eliminated.

In contrast, in the configuration of the light-emitting element 10 according to this embodiment, the metal layer 17 and the first electrode 14 are conducted to each other. Thus, accuracy in setting a formation position of the metal layer 17 and the formation position of the first electrode 14, in particular, the overlapping accuracy need not be kept high. In other words, the accuracy in positioning and forming the metal layer 17 and the first electrode 14 in the light-emitting element 10 may be lower than that in the light-emitting element of Comparative Example 1.

Figure 3:
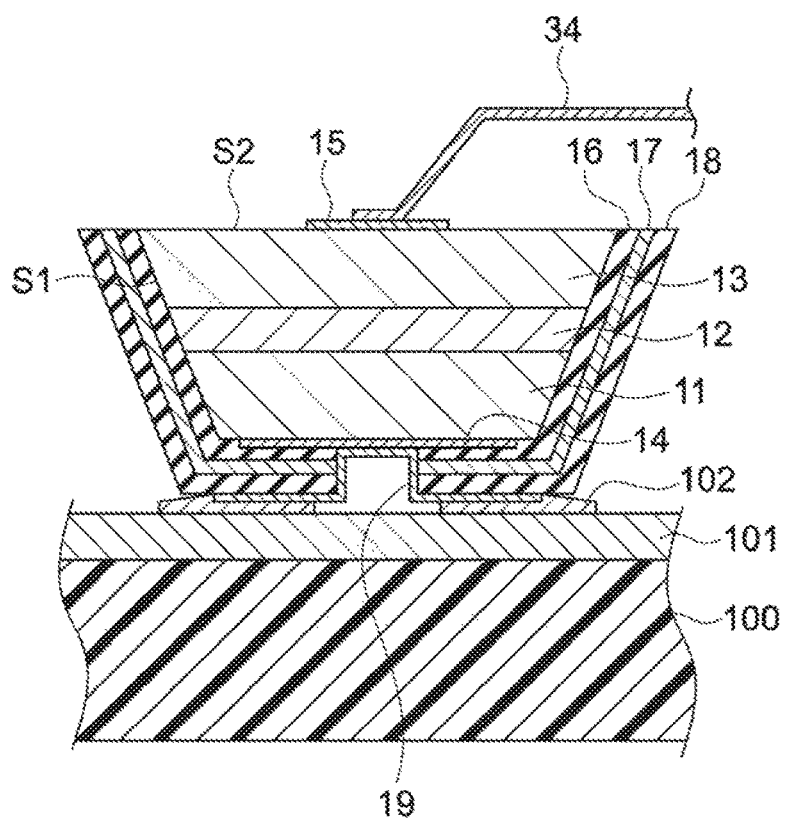
FIG. 3 is a cross-sectional view of a schematic configuration of the light-emitting unit including the light-emitting element and a substrate, the light-emitting element being mounted to the substrate.

Incidentally, as illustrated in FIG. 3, the light-emitting element 10 according to this embodiment is mounted to the substrate 100 including a wire 101 (or terminal electrodes 31 described below). Also in FIGS. 1A and 1B, this substrate 100 is indicated by the dashed lines. A connecting portion 34

(refer to FIGS. 1A and 1B) described below is connected to the second electrode 15. In this case, for example, in a case where polarities of voltages to be applied to the first electrode and the second electrode are inappropriate, when silver or copper is used as a metal material (hereinafter, for the sake of convenience of description, referred to as joint portion) that connects the first electrode and the wire on the substrate to each other, there is a risk in that ion migration occurs from the joint portion to the metal layer.

The ion migration refers to a phenomenon that positively-ionized metal atoms move from an anode side to a cathode side. For example, in FIG. 4A, on a premise that the first-conductivity-type layer 11 is a p-type semiconductor layer, and that the second-conductivity-type layer 13 is an n-type semiconductor layer, when a positive voltage is applied to the first electrode 14 connected to the p-type semiconductor layer, there is a risk in that the ion migration occurs from a joint portion 102 between the first electrode 14 and the substrate 100 to the metal layer 117 in a floating potential state. Further, when few pinholes and film-deteriorated parts are formed in the insulating layers, or when a metal-ion diffusion coefficient of the insulating layers themselves is high, dielectric breakdown may occur, resulting in short-circuiting.

Among materials to be used as that for the joint portion 102, metal materials that are liable to cause the ion migration are silver, copper, lead, tin, gold, nickel, palladium, or an alloy of at least two of these metals (such as solder). The ion migration may occur not only from the joint portion 102, but also from the wire 101 on the substrate 100. Note that, the joint portion 102 is typically formed by electrolytic plating.

Figure 5:
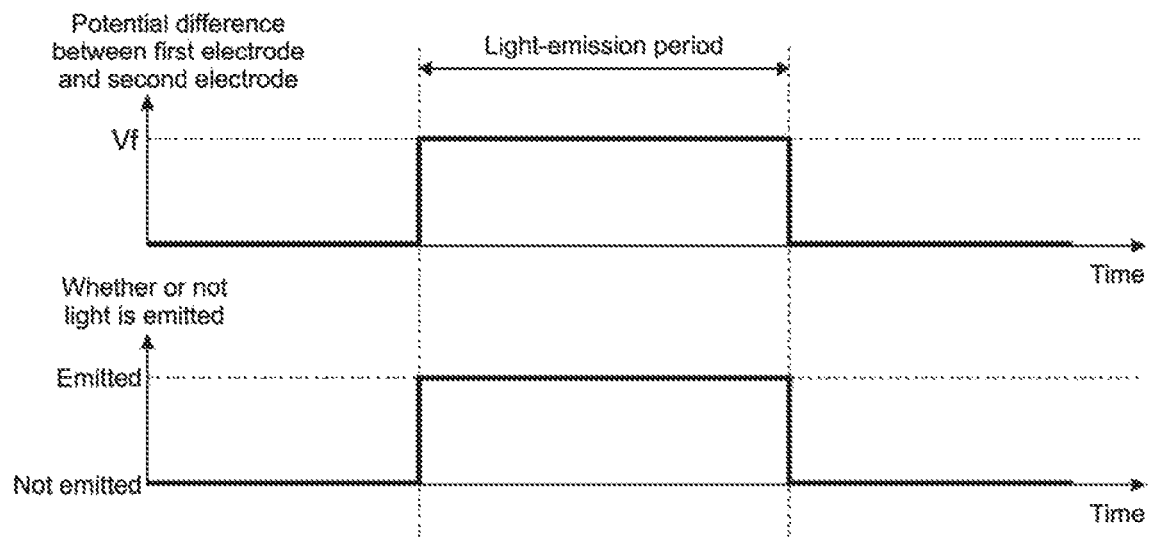
FIG. 5 shows an example of a method for driving the light-emitting element.

FIG. 5 shows an example of a method for driving the light-emitting element 10. The upper chart of FIG. 5 shows a potential difference between the first electrode 14 and the second electrode 15, and the lower chart of FIG. 5 shows whether or not light is emitted (emitted or not emitted). The abscissa axes represent time. As shown in FIG. 5, when the potential difference is substantially 0 V, the light-emitting element does not emit light. When the potential difference is generated, that is, in this embodiment, in the case where the first-conductivity-type layer 11 is the p-type semiconductor layer, when a positive voltage Vf is applied to the first electrode 14, the light-emitting element emits light.

In each of the light-emitting elements 10 according to this embodiment, which are illustrated in FIGS. 1A and 1B even when the positive voltage is applied in this way to the first electrode 14 connected to the p-type semiconductor layer, the ion migration does not occur. In the configuration of the light-emitting element 10 according to this embodiment, the metal layer 17 is conducted to the first electrode 14 connected to the p-type semiconductor layer. Thus, as described above, the ion migration from the joint portion 102 or the wire 101 on the substrate 100 to the metal layer 17 can be prevented. With this, short-circuiting and leakage current can be prevented.

Further, at the time of emitting light, a negative voltage is applied to the second electrode 15. Thus, even when the second electrode 15 is made of the material that is liable to cause the ion migration, the ion migration does not occur from the second electrode 15 (or connecting portion 34 connected thereto) to the metal layer 17. This is because a potential at the metal layer 17 is higher than a potential at the second electrode 15. Thus, even when the second electrode 15 has an area larger than that in the figure, or even when the second electrode 15 is arranged closer to the metal layer 17 than in the figure, the ion migration does not occur.

In addition, as illustrated in FIG. 3, the joint portion 102 and the second electrode 15 are spaced away from each other, and hence the ion migration is unlikely to occur from the joint portion 102 to the second electrode 15.

In this embodiment, the first electrode portion and the metal layer 17 are connected to each other, and hence the light leakage to the substrate 100 side does not occur. With this, a resin material arranged on the substrate 100 side, specifically, a photosensitive resin is not irradiated, and hence the resin material can be prevented from being deteriorated.

When the resin contracts or volatilizes by being deteriorated, stress is generated in the resin. As a result, cracks or the like may be formed. Further, humidity and gases may intrude through spaces formed of the cracks or the like in the resin. As a result, corrosion occurs. As a typical example of the resin material arranged on the substrate 100 side, there is a resin (temporary fixation portion) arranged between the light-emitting element and the substrate in the manufacturing step illustrated in FIGS. 1A and 1B of Japanese Patent Application Laid-open No. 2011-233733. In Japanese Patent Application Laid-open No. 2011-233733, a shield metal wiring layer on the substrate 100 and the light-emitting element are connected to each other through intermediation of an electrolytically plated layer.

1.3.2) Comparative Example 2

Figure 4B:
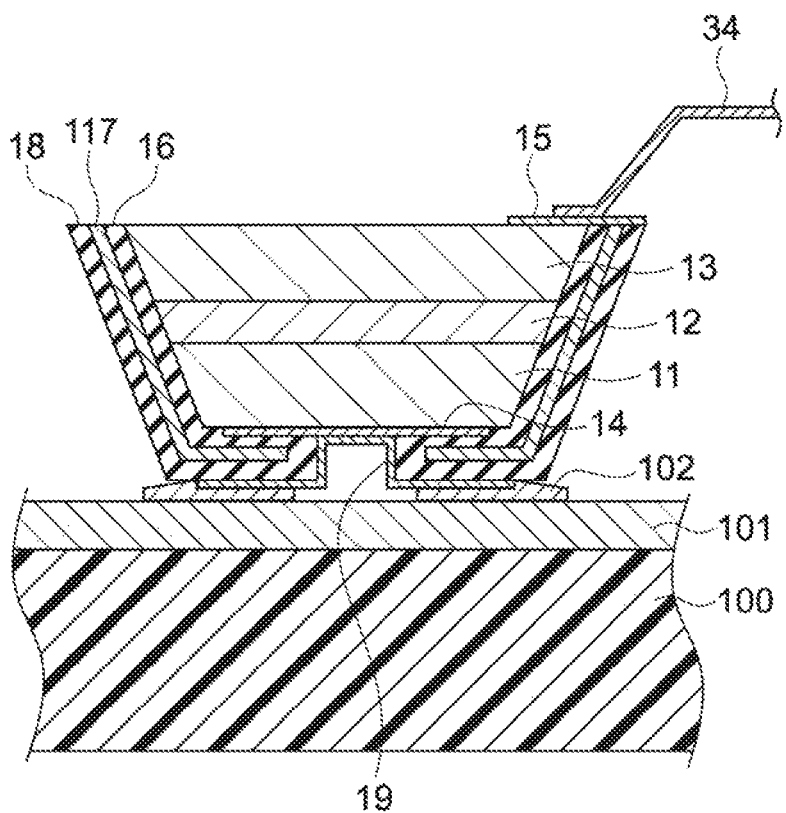
FIG. 4B is a cross-sectional view of a light-emitting element according to Comparative Example 2.

FIG. 4B illustrates a light-emitting element according to Comparative Example 2. In this light-emitting element, the metal layer 117 is insulated from the first electrode 14, and is connected and conducted to the second electrode 15. The second electrode 15 is not arranged at a center of the light-emitting surface S2, and connected to an end portion of the metal layer 117, which is arranged on the light-emitting surface S2 side.

In this Comparative Example 2, the metal layer 117 is conducted to the second electrode 15, but is not conducted to the first electrode 14. Thus, the formation positions of the first electrode 14 and the metal layer 117 need to be set with high accuracy. Further, in this Comparative Example 2, in the case where the first-conductivity-type layer 11 is of the p-type, when a positive voltage is applied to the first electrode 14 so as to emit light, there is a risk in that the ion migration occurs from the joint portion 102 between the first electrode 14 and the substrate 100 to the metal layer 117.

4) Insulator and Terminal Electrode

As illustrated in FIG. 1A, the light-emitting unit 1 further includes a chip-like insulator 20 that covers the light-emitting elements 10, and the terminal electrodes 31 and terminal electrodes 32 electrically connected to the light-emitting elements 10. The terminal electrodes 31 and 32 are arranged on a bottom surface side of the insulator 20.

The insulator 20 surrounds and holds the light-emitting elements 10 at least from the side surface sides of the light-emitting elements 10. The insulator 20 is made, for example, of a resin material such as silicone, acrylic, and epoxy.

The insulator 20 is formed in contact with the side surfaces of the light-emitting elements 10 and parts of the upper surfaces of the light-emitting elements 10. The insulator 20 is formed into an elongated shape (for example, rectangular-parallelepiped shape) extending in the array direction of the light-emitting elements 10. A height of the insulator 20 is set larger than a height of each of the light-emitting elements 10, and a horizontal width (width in a transverse direction) of the insulator 20 is set larger than a width of each of the light-emitting elements 10. A size of the insulator 20 itself is set, for example, to 1 mm or less.

As illustrated in FIGS. 1A and 1B, the insulator 20 has openings 20A, for example, at positions directly on the light-emitting elements 10. At least the second electrode 15 (not illustrated in FIG. 1A or 1B) is exposed in a bottom plane of each of the openings 20A. Further, the insulator 20 also has openings 20B, for example, at positions directly under the light-emitting elements 10. At least the pad electrode 19 (or first electrode 14) (not illustrated in FIG. 1A or 1B) is exposed in a bottom plane of each of the openings 20B.

The pad electrodes 19 (or first electrodes 14) are each connected to the terminal electrode 31 through intermediation of a predetermined conductive member (such as solder and plated metal). As described above, the wire 101 may serve as the terminal electrode 31. Meanwhile, the second electrodes 15 are connected to the terminal electrodes 32 through intermediation of bumps 33 and the connecting portions 34 illustrated in FIG. 1A. The bumps 33 refer to columnar conductive members embedded in the insulator 20, and the connecting portions 34 refer to belt-like conductive members formed on an upper surface of the insulator 20.

Note that, from a viewpoint of hindering the light emitted from the active layer 12 from directly entering other ones of the light-emitting elements 10, the following conditions should be satisfied. Specifically, the metal layer 17 only needs to be formed in contact at least with an opposed surface of the surface of the first insulating layer 16, the opposed surface facing the side surfaces of the active layer 12, and need not necessarily cover parts other than the parts facing the side surfaces of the active layer 12. In this case, the first insulating layer 16 only needs to be formed in contact at least with parts of the semiconductor-layer side surfaces S1, the parts facing the side surfaces of the active layer 12, and need not necessarily cover the entireties of the semiconductor-layer side surfaces S1.

Further, the metal layer 17 only needs to cover at least one of the semiconductor-layer side surfaces S1, the at least one being on a side of adjacent one of the light-emitting elements 10, and need not necessarily cover all of the semiconductor-layer side surfaces S1. In this case, the first insulating layer 16 only needs to cover the at least one of the semiconductor-layer side surfaces S1, the at least one being on the side of adjacent one of the light-emitting elements 10, and need not necessarily cover all of the semiconductor-layer side surfaces S1.

Note that, from a viewpoint of preventing the first-conductivity-type layer 11 and the second-conductivity-type layer 13 from short-circuiting to each other through intermediation of the metal layer 17, in either one of the cases, it is preferred that the metal layer 17 not protrude from the surface of the first insulating layer 16.

When the three light-emitting elements 10 of the light-emitting unit 1 are the light-emitting elements 10R, 10G, and 10B, it is preferred that all of the light-emitting elements 10 include the above-described laminated bodies. However, all of the light-emitting elements 10 need not necessarily include the above-described laminated bodies. For example, of the three light-emitting elements 10, only the light-emitting element 10B that emits light with a shortest wavelength may include the above-described laminated body. Alternatively, for example, of the three light-emitting elements 10, only light-emitting elements other than the light-emitting element 10R that emits light with a longest wavelength (specifically, light-emitting elements 10G and 10B) may include the above-described laminated bodies.

2. Embodiment 2

2.1) Configuration of Light-Emitting Element

Figure 6:
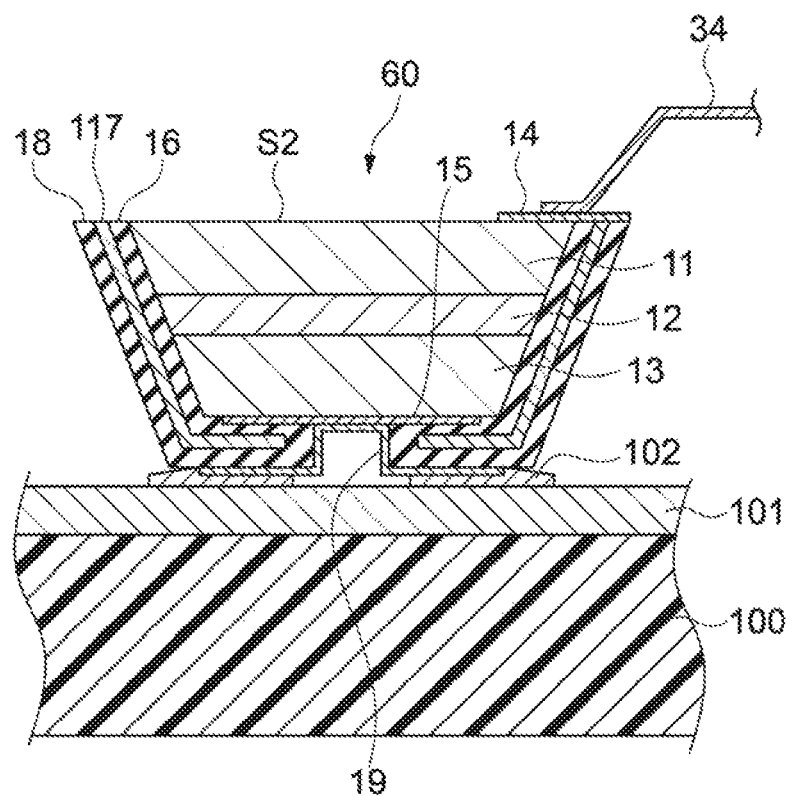
FIG. 6 is a cross-sectional view of a light-emitting element according to Embodiment 2 of the present technology and the substrate, the light-emitting element being mounted to the substrate.

FIG. 6 is a cross-sectional view of a light-emitting element 60 according to Embodiment 2 of the present technology and the substrate 100, the light-emitting element 60 being mounted to the substrate 100. In the following description, components, functions, and the like, which are substantially the same as those of the light-emitting elements according to the embodiment illustrated, for example, in FIG. 2, are denoted by the same reference symbols to simplify or omit redundant description thereof, and differences are mainly described.

In the light-emitting element 10 according to Embodiment 1 described above, the second-conductivity-type layer 13 has a surface in contact with the active layer 12 (first surface) and the light-emitting surface S2 on its opposite side, to which the second electrode 15 is connected (second surface). In contrast, in the light-emitting element 60 according to Embodiment 2, the first-conductivity-type layer 11 being the p-type semiconductor layer has the surface in contact with the active layer 12 (first surface), and the light-emitting surface (second surface) S2 on the opposite side, to which the first electrode 14 is connected.

The structure of the light-emitting element 60 is apparently the same as the structure of the light-emitting element according to Comparative Example 2 illustrated in FIG. 4B, but is different therefrom in that positions of the first-conductivity-type layer 11 and the second-conductivity-type layer 13 being the n-type semiconductor layer are replaced with each other in a vertical direction. The first electrode 14 connected to the first-conductivity-type layer 11 is not arranged at the center of the light-emitting surface S2, but connected to the metal layer 117 across an end surface on the light-emitting surface S2 side of the first insulating layer 16. In other words, the metal layer 117 is conducted to the first electrode 14. Further, the metal layer 117 is insulated from the second electrode 15 (pad electrode 19) connected to the second-conductivity-type layer 13.

In the light-emitting element 60 configured as described above, a positive voltage is applied to the first electrode 14 connected to the first-conductivity-type layer 11 being the p-type semiconductor layer. With this, the ion migration from the joint portion 102 to the metal layer 117 can be prevented.

2) Comparison to Comparative Example

Figure 7:
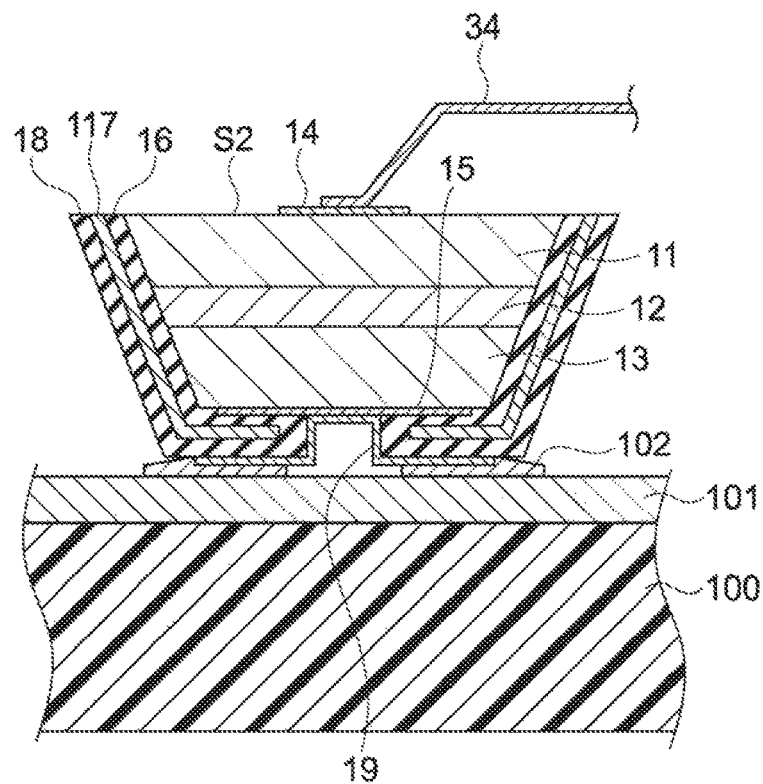
FIG. 7 is a cross-sectional view of a light-emitting element according to Comparative Example 3 and the substrate, the light-emitting element being mounted to the substrate.

FIG. 7 is a cross-sectional view of a light-emitting element according to Comparative Example 3 and the substrate 100, the light-emitting element to be mounted to the substrate 100. In the light-emitting element according to Comparative Example 3, as in the light-emitting element 60 described above, an upper surface of the first-conductivity-type layer 11 being the p-type semiconductor layer serves as the light-emitting surface S2, and the first electrode 14 is connected thereto. The structure of the light-emitting element according to Comparative Example 3 is apparently the same as the structure of the light-emitting element according to Comparative Example 1 illustrated in FIG. 4A.

In the light-emitting element according to Comparative Example 3, the connecting portion 34 connected to the first electrode 14 is made of the material that is liable to cause the ion migration. In this case, when a positive voltage is applied to the first electrode 14 so as to emit light, there is a risk of ion migration to an upper end portion of the metal layer 117 through the first electrode 14, the surface of the first-conductivity-type layer 11, and the first insulating layer 16. Note that, when the first electrode 14 and the upper end portion of the metal layer 117 are sufficiently spaced from each other, the risk of the ion migration is reduced.

3. Embodiment 3

3.1) Configuration of Light-Emitting Element

Figure 8:
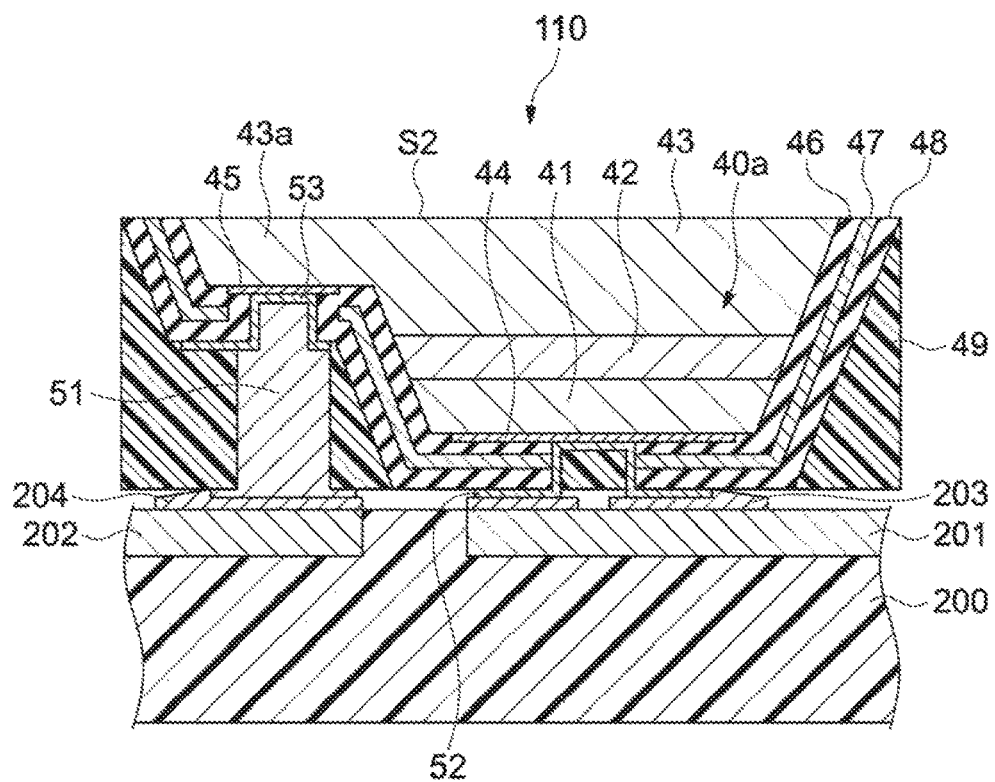
FIG. 8 is a cross-sectional view of a light-emitting element according to Embodiment 3 of the present technology.

FIG. 8 is a cross-sectional view of a light-emitting element according to Embodiment 3 of the present technology. The light-emitting elements 10 and 60 according to Embodiments 1 and 2 described above are each a light-emitting element of a two-side-electrode type in which the first electrode 14 and the second electrode 15 are arranged at top and bottom. A light-emitting element 110 according to Embodiment 3 is a light-emitting element of a one-side-electrode type in which a first electrode 44 and a second electrode 45 are arranged on a substrate 200 side. In other words, the light-emitting element 110 is a light-emitting element of a flip-chip type.

The light-emitting element 110 includes not only a semiconductor layer including a first-conductivity-type layer 41, an active layer 42, and a second-conductivity-type layer 43, but also the first electrode 44, the second electrode 45, and pad electrodes 52 and 53. Further, the light-emitting element 110 also includes a laminated body including a first insulating layer 46, a metal layer 47, and a second insulating layer 48.

In the semiconductor layer, a part including a part of the second-conductivity-type layer 43, the active layer 42, and the first-conductivity-type layer 41 forms a mesa portion 40a inverted upside down, that is, is formed into an inverse trapezoidal shape. In the semiconductor layer, a skirt of the mesa portion 40a includes a jetty portion 43a formed of a part of the second-conductivity-type layer 43, which jetties from the mesa portion 40a. The second electrode 45 is connected to a lower surface of the jetty portion 43a of the second-conductivity-type layer 43.

The light-emitting element 110 includes an embedding layer 49 that covers the mesa portion 40a. The pad electrode (first connecting-conductive portion) 52 is connected, through intermediation of a joint portion 203, to a wire 201 arranged on the substrate 200. A columnar bump 51 (second connecting-conductive portion) formed in the embedding layer 49 is connected to a joint portion 204 on a wire 202 arranged on the substrate 200, and the second electrode 45 is connected to the bump 51 through intermediation of the pad electrode 53. The columnar bump 51 is connected to the pad electrode 53 through the first insulating layer 46 and the second insulating layer 48.

The metal layer 47 of the laminated body is conducted to the first electrode 44 by being connected to the pad electrode 52. The metal layer 47 is insulated from the second electrode 45 (pad electrode 53).

3.2) Comparison to Comparative Examples

3.2.1) Comparative Example 4

Figure 9A:
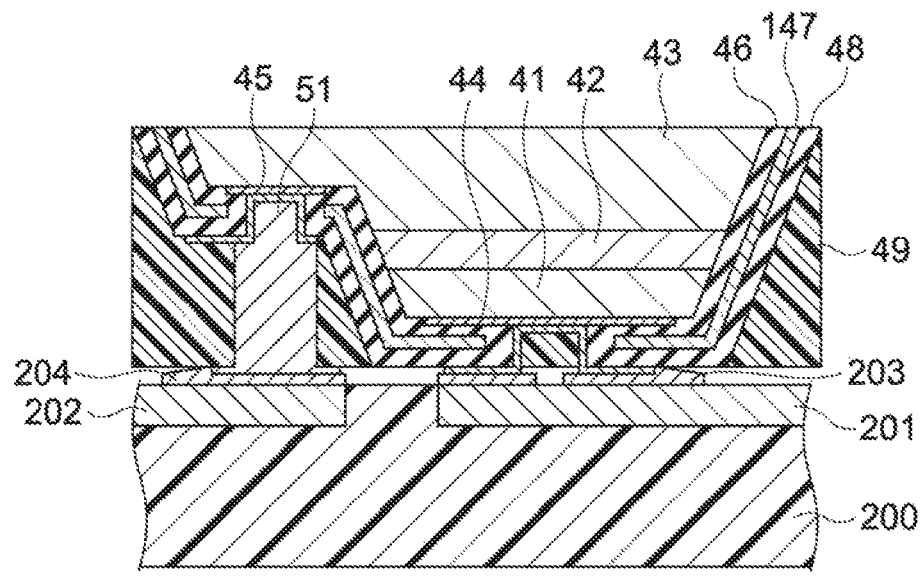
FIG. 9A is a cross-sectional view of a light-emitting element according to Comparative Example 4 and a substrate.

FIG. 9A is a cross-sectional view of a light-emitting element according to Comparative Example 4 and the substrate 200. In this light-emitting element, a metal layer 147 is insulated from both the first electrode 44 and the second electrode 45. In contrast, in the configuration of the light-emitting element 110 according to this embodiment, the metal layer 47 and the first electrode 44 are conducted to each other. Thus, accuracy in setting a formation position of the metal layer 47 and the formation position of the first electrode 44, in particular, requirements for overlapping accuracy therebetween can be relaxed. In other words, the accuracy in positioning and forming the metal layer 47 and the first electrode 44 in the light-emitting element 110 may be lower than that in the light-emitting element of Comparative Example 4.

Further, in the light-emitting element 110 according to this embodiment, in a case where the first-conductivity-type layer 41 is the p-type semiconductor layer, when a positive voltage is applied to the first electrode 44 so as to emit light, ion migration from the joint portion 203 or the wire 201 on the substrate 200 to the metal layer 47 does not occur.

Further, at the time of emitting light, a negative voltage at a potential lower than that on the first electrode 44 side is applied to the second electrode 45 connected to the second-conductivity-type layer 43 being the n-type semiconductor layer. Thus, ion migration from the wire 202, the joint portion 204, or the bump 51 to the metal layer 47 can be prevented.

In addition, in the light-emitting element 110 according to this embodiment, the metal layer 47 and the pad electrode 52 are connected. Thus, as described above in Embodiment 1, the light leakage can be prevented.

3.2.2) Comparative Example 5

Figure 9B:
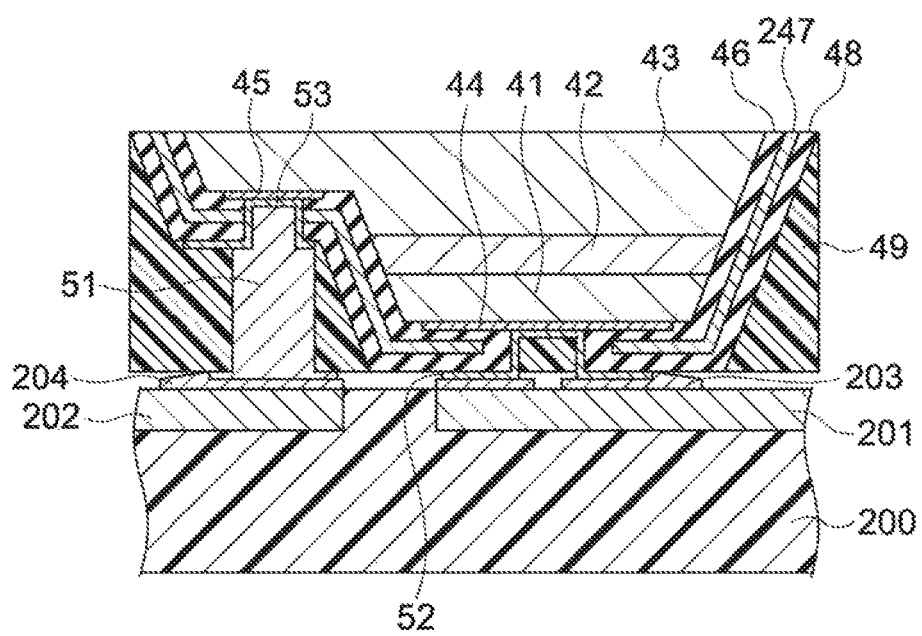
FIG. 9B is a cross-sectional view of a light-emitting element according to Comparative Example 5 and the substrate.

FIG. 9B is a cross-sectional view of a light-emitting element according to Comparative Example 5 and the substrate 200. In this light-emitting element, a metal layer 247 is conducted to the second electrode 45 connected to the second-conductivity-type layer 43 being the n-type semiconductor layer, and is insulated from the first electrode 44 connected to the first-conductivity-type layer 41 being the p-type semiconductor layer. When a positive voltage is applied to the first electrode 44 so as to emit light, there is a risk of ion migration from the joint portion 203 and the wire 201 on the substrate 200 to the metal layer 247 conducted to a negative side.

4. Embodiment 4

Figure 10:
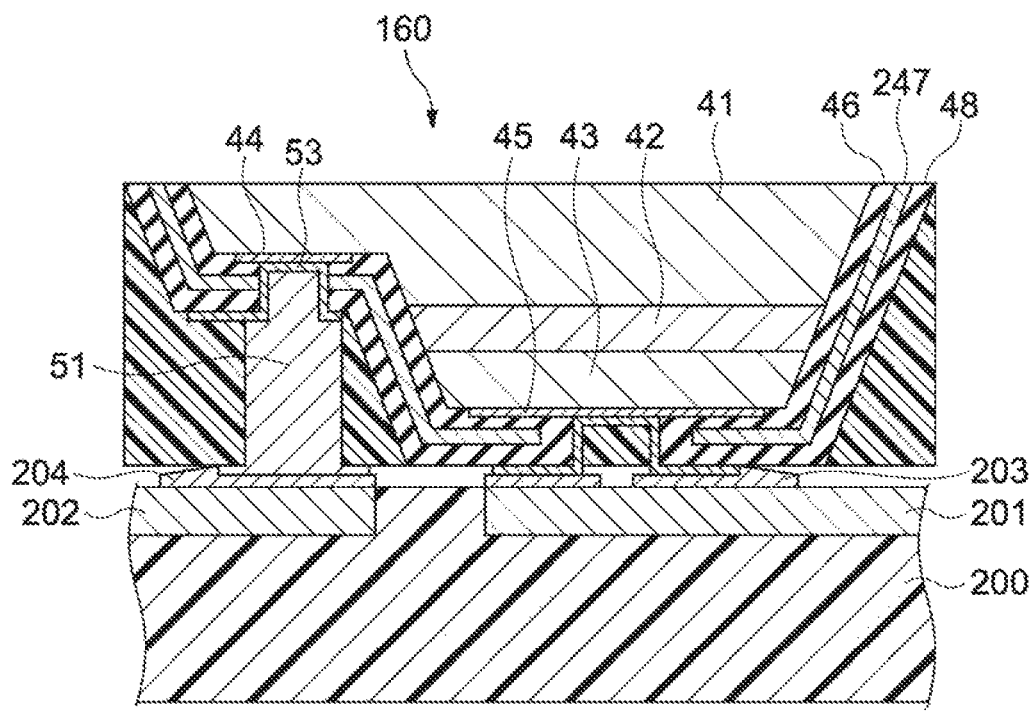
FIG. 10 is a cross-sectional view of a light-emitting element according to Embodiment 4 of the present technology and the substrate.

FIG. 10 is a cross-sectional view of a light-emitting element 160 according to Embodiment 4 of the present technology and the substrate 200. The structure of the light-emitting element 160 according to this embodiment is apparently the same as the structure of the light-emitting element according to Comparative Example 5 illustrated in FIG. 9B. However, in the light-emitting element 160, the second electrode 45, the second-conductivity-type layer 43 being the n-type semiconductor layer, the active layer 42, and the first-conductivity-type layer 41 being the p-type semiconductor layer are laminated in this order from the substrate 200 side, and the first electrode 44 is connected to the first-conductivity-type layer 41. The columnar bump 51 is connected to the pad electrode 53 through the first insulating layer 46 and the second insulating layer 48.

Even when a positive voltage is applied to the first electrode 44 so as to emit light, the metal layer 247 is conducted to the first electrode 44, and hence the ion migration from the joint portion 204 or the wire 202 on the substrate 200 to the metal layer 247 conducted to a positive side, that is, a side at a higher potential can be prevented.

In contrast, although not shown, according to Comparative Example 6, in the case where the metal layer is conducted to the second electrode (for example, second electrode 45 illustrated in FIG. 10), and insulated from the first electrode (first electrode 44 illustrated in FIG. 10), when a positive voltage is applied to the first electrode, there is a risk of ion migration from the first electrode side to the metal layer.

However, in the light-emitting element 160 and the light-emitting element according to Comparative Example 6 described above, requirements for accuracy in setting the formation positions of the metal layer and both the first and the second electrodes can be relaxed to be lower than that in the case where the metal layer is insulated from both the electrodes.

5. Embodiment 5

5.1) Configuration of Light-Emitting Panel Device

When n×m light-emitting elements (where n and m are each an integer number equal to or greater than 2) arranged in matrix are mounted to a substrate, a "light-emitting panel" is obtained. The light-emitting panel refers, for example, to an illumination panel and an image display panel. In particular, when the light-emitting unit 1 illustrated in FIGS. 1A and 1B includes n×m light-emitting units 1 (where n and m are each an integer number equal to or greater than 2) that are arranged in matrix and mounted to a substrate, a full-color-image display panel is obtained.

A "light-emitting panel device" including the illumination panel or the display panel as described above includes a drive circuit that drives these light-emitting elements. The light-emitting panel device which includes the illumination panel refers to an "illumination device." The light-emitting panel device which includes the display panel refers to the "display device." Now, the light-emitting panel device is described by way of an example of the display device including the display panel.

5.1.1) Configuration of Display Panel

Figure 11:
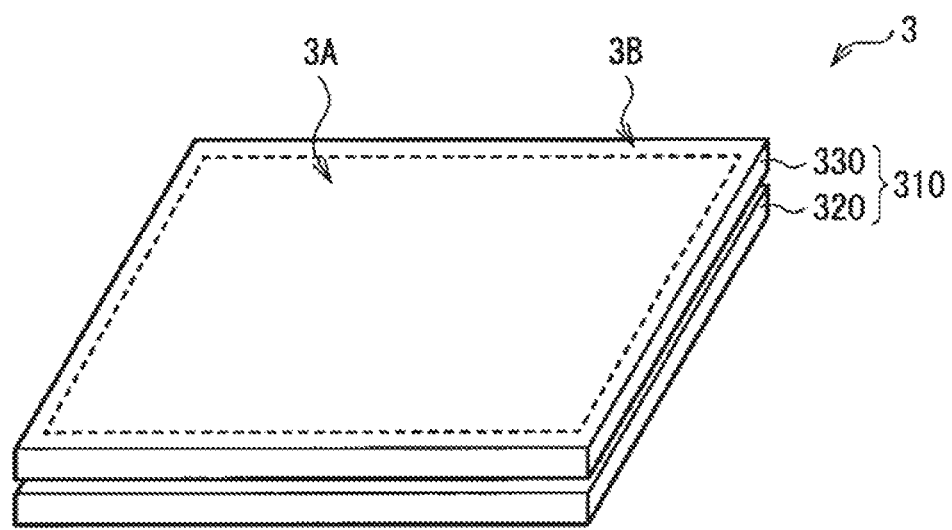
FIG. 11 is a schematic perspective view of a display device (light-emitting panel device) according to one embodiment.

FIG. 11 is a schematic perspective view of a display device 3 as an example. The display device 3 includes, as the display pixels, the light-emitting units 1 according to Embodiments described above. The display device 3 includes a display panel 310, and the above-mentioned drive circuit (not shown) that drives the display panel 310.

The display panel 310 includes a mounting substrate 320 (such as the above-described substrates 100 and 200) and a transparent substrate 330 that are superimposed on each other. The transparent substrate 330 has a surface to serve as a video display screen, and includes a display region 3A at a central part thereof, and a frame region 3B being a non-display region therearound.

5.1.2) Mounting Substrate

Figure 12:
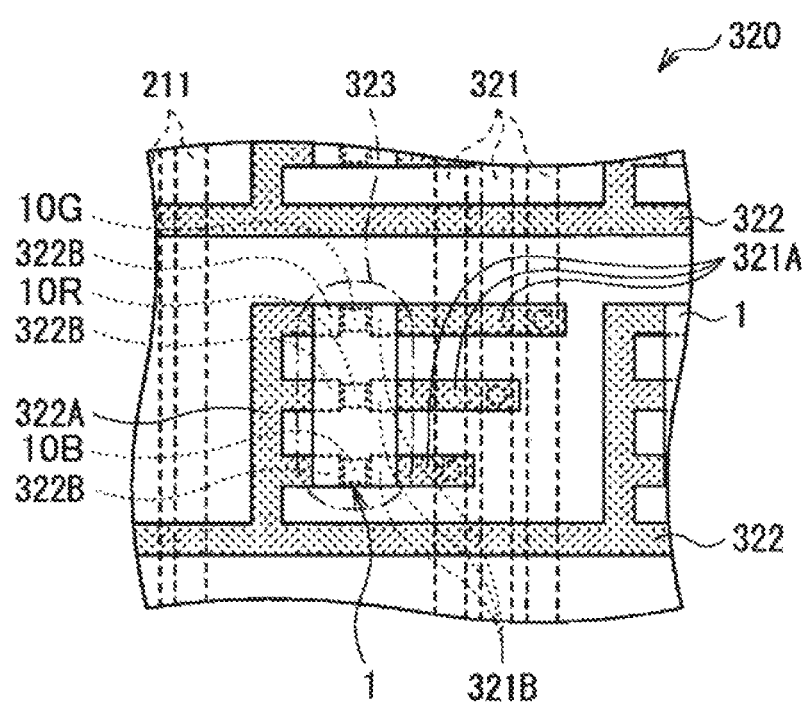
FIG. 12 illustrates an example of a layout in a region of a surface on a transparent substrate side of a mounting substrate, the region corresponding to a display region.

FIG. 12 illustrates an example of a layout in a region of the surface on the transparent substrate 330 side of the mounting substrate 320, the region corresponding to the display region 3A. In the region of the surface of the mounting substrate 320, which corresponds to the display region 3A, for example, a plurality of data wires 321 are formed to extend in a predetermined direction, and are arranged in parallel to each other at a predetermined pitch. In addition, in the region of the surface of the mounting substrate 320, which corresponds to the display region 3A, for example, a plurality of scanning wires 322 are formed to extend in a direction intersecting with the data wires 321 (for example, direction orthogonal thereto), and are arranged in parallel to each other at a predetermined pitch.

The scanning wires 322 are formed, for example, on an outermost layer, more specifically, on an insulating layer (not shown) formed on a surface of a base material. Note that, as examples of the base material for the mounting substrate 320, there are a glass substrate and a resin substrate. The insulating layer on the base material is made, for example, of SiN, $SiO_2$, or $Al_2O_3$. Meanwhile, the data wires 321 are formed in a layer other than the outermost layer including the scanning wires 322 (such as layer under the outermost layer), for example, in the insulating layer on the base material. On the surface of the insulating layer, not only the scanning wires 322 but also, for example, black is arranged as appropriate.

A display pixel 323 is formed in a vicinity of intersection parts between the data wires 321 and the scanning wires 322, and includes a plurality of display pixels 323 arranged in matrix in within the display region 3A. The light-emitting unit 1 including the plurality of light-emitting elements 10 (or light-emitting elements 60, 110, or 160) is mounted as each of the display pixels 323.

In the light-emitting unit 1, the light-emitting elements 10R, 10G, and 10B each include the above-mentioned pair of terminal electrodes 31 and 32. Further, the terminal electrode 31 on one side is electrically connected to the data wire 321, and the terminal electrode 32 on another side is electrically connected to the scanning wire 322. For example, the terminal electrodes 31 are each electrically connected to a pad electrode 321B at a distal end of a branch 321A of the data wire 321. Further, for example, the terminal electrodes 32 are each electrically connected to a pad electrode 322B at a distal end of a branch 322A of the scanning wire 322.

The pad electrodes 321B and 322B are formed, for example, on the outermost layer, and arranged, for example, at parts where, for example, the light-emitting units 1 are mounted as illustrated in FIG. 12. These pad electrodes 321B and 322B correspond to the joint portion 102 and 203 and the wire 101, 201 and 202 on the substrates (mounting substrates) 100 and 200 of Embodiments described above.

The mounting substrate 320 further includes a plurality of support posts (not shown) that regulate a gap between the mounting substrate 320 and the transparent substrate 330. The support posts may be arranged within a region facing the display region 3A, or may be arranged within a region facing the frame region 3B.

5.2) Driving Method that Uses Drive Circuit of Light-Emitting Panel Device

As general examples of drive systems with the drive circuit of the display device, there are a passive matrix system and an active matrix system. The wiring structure illustrated in FIG. 12 is a wiring structure for the passive matrix system. In the passive matrix system, in order to suppress light emission by non-selected lines (crosstalk), a bias reverse to that at the time of emitting light may be applied to light-emitting elements in the non-selected lines.

Figure 13:
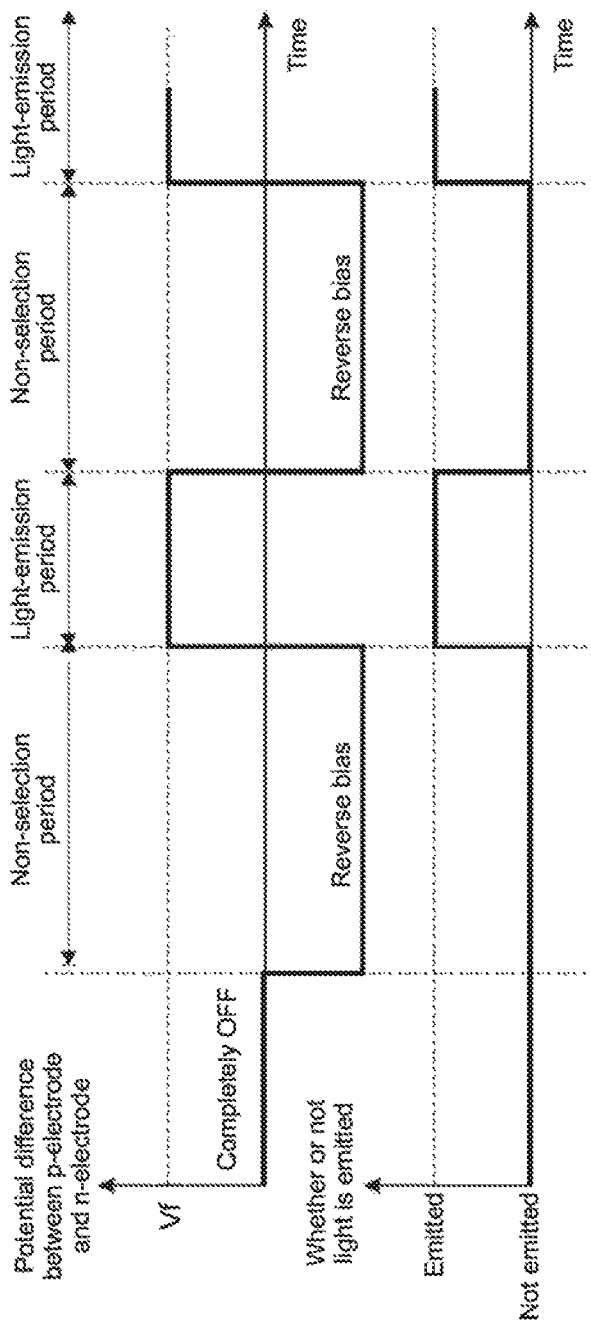
FIG. 13 shows an example of a driving method for generating reverse bias voltages in a passive-matrix drive system.

When a large number of light-emitting elements are arranged, that is, when a large number of scanning wires are arranged, the number of selected lines is larger than the number of the non-selected lines. Thus, at the time of driving a light-emitting element of certain one pixel (or one line), voltage is applied as shown in FIG. 13. A non-selection period (non-light-emission period) of the light-emitting element of the one pixel is sufficiently longer than a selection period (light-emission period) of the same.

FIG. 13 shows the drive voltages in that case. The upper chart of FIG. 13 shows a potential difference between an electrode connected to the p-type semiconductor layer (hereinafter, referred to as p-type electrode) and an electrode connected to the n-type semiconductor layer side (hereinafter, referred to as n-type electrode). The lower chart of FIG. 13 shows whether or not light is emitted (emitted or not emitted). The upper chart of FIG. 13 is better understood when the ordinate axis is regarded as representing a potential at the p-type electrode.

As shown in FIG. 13, in order to suppress the above-mentioned crosstalk, a reverse bias voltage is applied in the non-selection periods. In other words, during the non-light-emission periods being the non-selection periods, a negative voltage is applied to the p-type electrode, and a positive voltage is applied to the n-type electrode. Meanwhile, during the light-emission periods being the selection periods each shorter than the non-selection period, the positive voltage is applied to the p-type electrode, and the negative voltage is applied to the n-type electrode. The drive circuit is configured to apply the positive voltage alternately to the electrodes in this way.

For example, when ten lines are driven simply by the passive matrix system, a reverse bias mode lasts ten times longer than a period for applying a forward voltage to emit light. Generally, displays have resolutions of from 640×480 to 1920×1080, or much higher. In such cases, it is important to secure reliability in the reverse bias mode.

In the reverse bias mode, in order to suppress the ion migration to the metal layer, it is preferred that the metal layer be conducted to the n-type electrode to which the positive voltage is applied. Whether in a forward bias mode or in the reverse bias mode, in order to suppress the ion migration to the metal layer, it is preferred that the drive circuit be configured as follows. Specifically, it is preferred that the drive circuit be configured to control timings of applying the voltage such that a period for applying the positive voltage to the n-type electrode is longer than a period for applying the positive voltage to the p-type electrode.

When the voltage-application period for the electrode (n-type electrode) to which the positive voltage is applied is set long in this way, a period and frequency of occurrence of the ion migration to the metal layer conducted to the electrode (n-type electrode) can be suppressed to be smaller than those in a case where the voltage-application period is short. With this, reliability of products is increased, and lives of the products can be prolonged.

The drive system described above is applicable not only to the display device, but also to the illumination device.

The light-emitting element, which is driven by the passive matrix system with the drive circuit that generates the reverse bias voltages during the non-light-emission periods so as to suppress the crosstalk, is obtained when the first-conductivity-type layer connected to the first electrode conducted to the metal layer of each the light-emitting elements 10, 60, 110, and 160 illustrated in FIGS. 2, 6, 8, and 10 is replaced with that of the n-type.

Not only the substrate including the wires and the circuit to be used in the passive matrix system as illustrated in FIG. 12, but also a substrate including wires and a circuit to be used in the active matrix system is encompassed within the scope of the present technology. In the case of the active matrix drive, there is no problem of the crosstalk, and hence the reverse bias drive is not used. In that case, the first-conductivity-type layer to which the first electrode conducted to the metal layer is connected is of the p-type, and the positive voltage is applied to the first electrode so as to emit light.

6. Embodiment 6

Figure 14A:
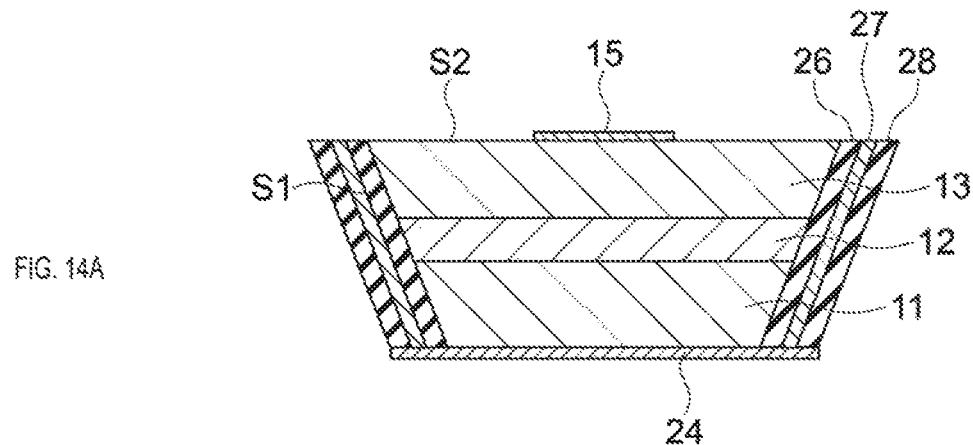
FIGS. 14A, 14B and 14C are cross-sectional views respectively illustrating light-emitting elements according to Embodiment 6 of the present technology.
Figure 14B:
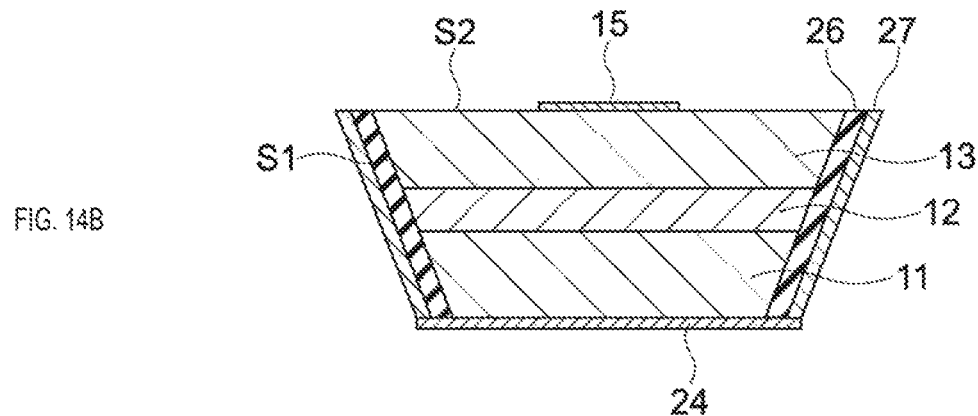
Figure 14C:
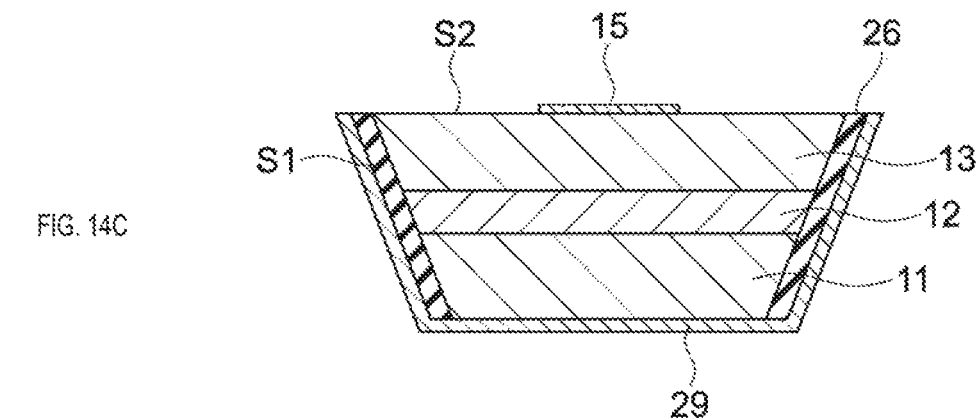

FIGS. 14A, 14B and 14C are cross-sectional views respectively illustrating light-emitting elements according to Embodiment 6 of the present technology.

The light-emitting element illustrated in FIG. 14A includes a first electrode 24 connected to the first-conductivity-type layer 11. The first electrode 24 may be formed of multi-layer metals of different types. The first electrode 24 is connected to the substrate 100 through intermediation of, for example, the joint portion 102 as described above.

The laminated body including a first insulating layer 26, a metal layer 27, and a second insulating layer 28 covers substantially the entireties of the semiconductor-layer side surfaces S1. An edge portion of the first electrode 24 is connected to the metal layer 27 by being extended to a vicinity of a lower end portion of the metal layer 27. With this, the first electrode 24 and the metal layer 27 are conducted to each other.

The light-emitting element illustrated in FIG. 14B is obtained by omitting the second insulating layer 28 from the light-emitting element illustrated in FIG. 14A.

The light-emitting element illustrated in FIG. 14C includes a conductive film 29. The conductive film 29 is a film formed by integrating the metal layer and the first electrode with each other through the same film forming process. This film is formed by a method such as deposition and sputtering. The conductive film 29 covers the semiconductor-layer side surfaces S1 through intermediation of the first insulating layer 26. A lower portion of the conductive film 29 is connected to the lower surface of the semiconductor layer. The conductive film 29 may be formed of multi-layer metals of different types.

The first-conductivity-type layer 11 of each of the light-emitting elements illustrated in FIGS. 14A, 14B and 14C is typically of the p-type. In that case, a positive voltage is applied to the first electrode 24 and the conductive film 29 so as to emit light.

Alternatively, in a case where the driving method that uses the passive matrix system is applied to these light-emitting elements illustrated in FIGS. 14A, 14B and 14C as in Embodiment 5 described above, when the method that uses the reverse bias drive shown in FIG. 13 is used, those light-emitting elements have the configuration as follows. Specifically, the first-conductivity-type layer 11 is of the n-type, the second-conductivity-type layer 13 is of the p-type, and a period for applying the positive voltage to the first electrode 24 and the conductive film 29 is set longer than a period for applying the positive voltage to the second electrode 15.

The structures of the first electrode portion as described above with reference to FIGS. 14A, 14B and 14C are applicable, for example, also to the light-emitting elements of the one-side-electrode type illustrated in FIGS. 8, 9A, 9B and 10.

7. Embodiment 7

Figure 15A:
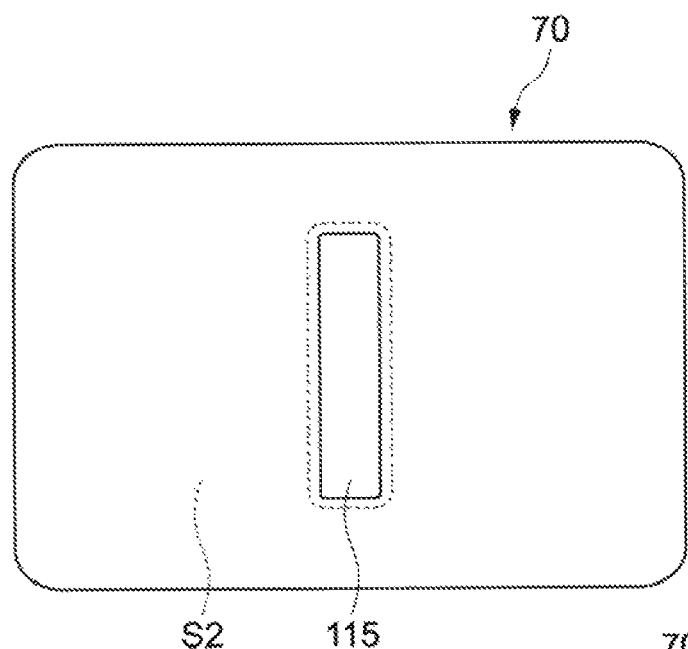
FIG. 15A is a plan view of a light-emitting element according to Comparative Example 6.
Figure 15B:
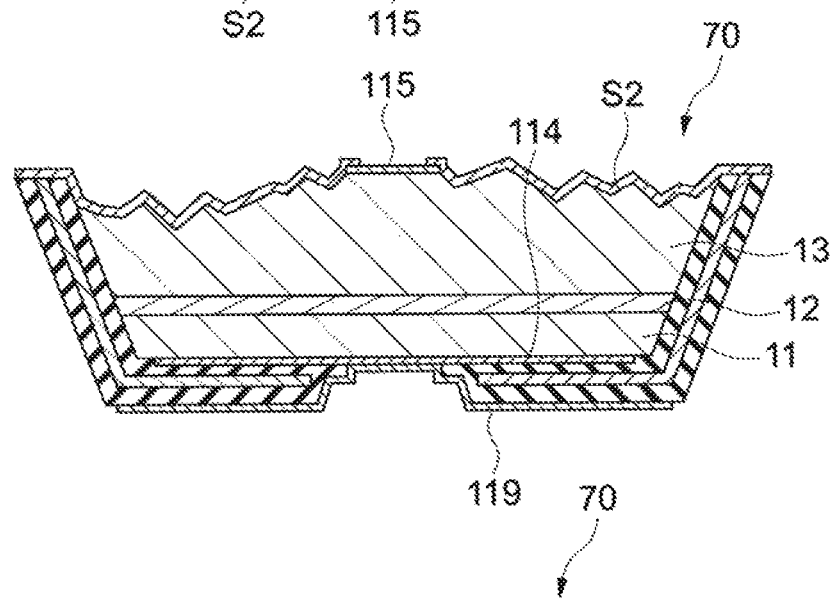
FIGS. 15B and 15C are respectively a cross-sectional view and a bottom view of the light-emitting element according to Comparative Example 6.
Figure 15C:
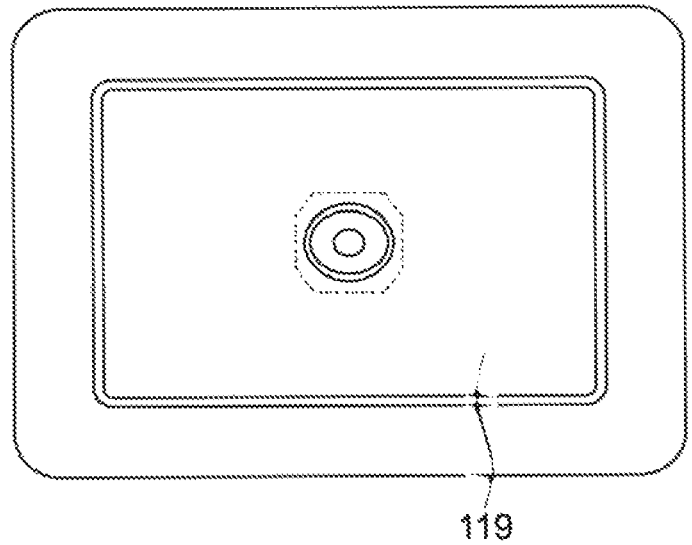

7.1) Trade-Off Relationship Between High Light-Emitting Efficiency and Small Footprint FIG. 15A is a plan view of a light-emitting element according to Comparative Example 6. FIGS. 15B and 15C are respectively a cross-sectional view and a bottom view of the light-emitting element 70 according to Comparative Example 6. The light-emitting element 70 according to Comparative Example 6 has a structure corresponding to that of the light-emitting element illustrated in FIG. 2 of Patent Literature 1 mentioned above.

The light-emitting element 70 includes a lower electrode 114 (or pad electrode 119 conducted thereto) and an upper electrode 115 respectively at centers of a lower portion (bottom portion) and an upper portion of the light-emitting element 70. The upper electrode 115 has a light-blocking function, and hence has a disadvantage of reducing efficiency in emitting light through the light-emitting surface S2. In order to increase the light-emitting efficiency, it may be appropriate to reduce an area of this upper electrode 115. However, when this area is excessively reduced, there is a risk of an open state in which the upper electrode 115 and a terminal for external connection (not shown) are not connected to each other. Thus, in order to increase the light-emitting efficiency, novel measures need to be taken.

Figure 16A:
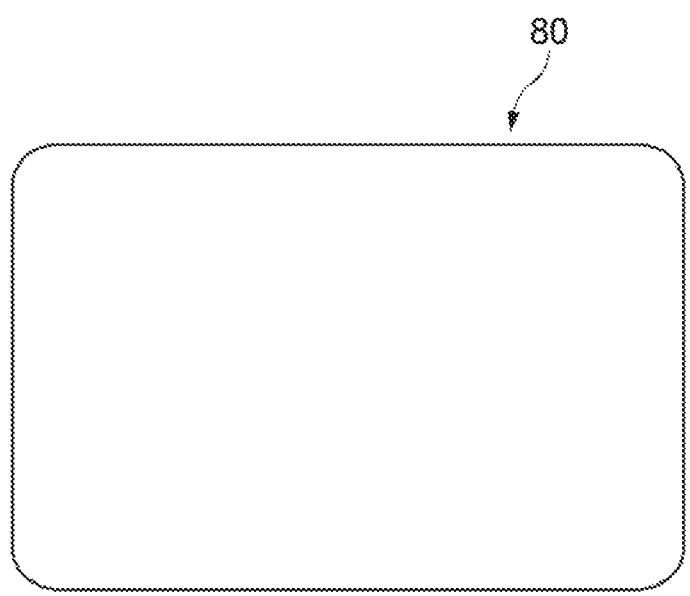
FIG. 16A is a plan view of a light-emitting element according to Comparative Example 7.
Figure 16B:
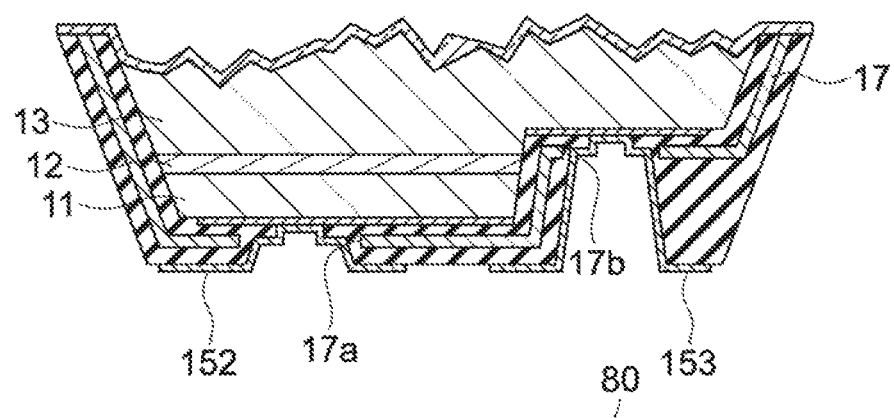
FIGS. 16B and 16C are respectively a cross-sectional view and a bottom view of the light-emitting element according to Comparative Example 7.
Figure 16C:
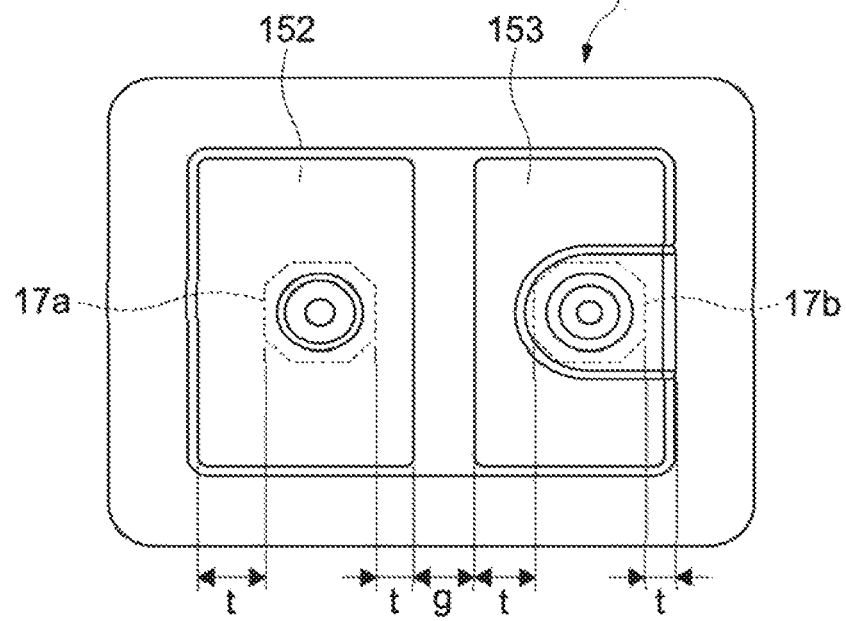

FIG. 16A is a plan view of a light-emitting element according to Comparative Example 7. FIGS. 16B and 16C are respectively a cross-sectional view and a bottom view of the light-emitting element 80 according to Comparative Example 7. The light-emitting element 80 according to Comparative Example 7 has a structure of the flip-chip type, which corresponds to that of the light-emitting element illustrated in FIG. 7 of Patent Literature 1 mentioned above.

In the light-emitting element 80 of such a flip-chip type, the electrodes are not arranged on the light-emitting surface side. However, the semiconductor layer including the active layer 12 needs to be etched, and hence an area of the active layer 12 (area in plan view) is reduced. As a result, intensity of light to be emitted decreases. In contrast, when the area of the active layer 12 is increased, a footprint of the light-emitting element 80 is increased.

Further, as illustrated in FIGS. 16B and 16C, an opening 17a (17b) of the metal layer 17 and a pad electrode 152 (153) need to be accurately overlapped with each other. The overlapping accuracy can be indicated by the arrows t in FIG. 16C. When the widths indicated by these arrows t are excessively small, leakage of the light from the active layer 12 through a bottom portion increases. As a result, the light-emitting efficiency decreases. In contrast, when the widths indicated by the arrows are excessively large, a sufficient gap g cannot be secured between the two pad electrodes 152 and 153 on one surface (bottom surface) of such a small chip. In other words, a degree of freedom in laying out the electrodes is low.

For those reasons, in order to achieve both high light-emitting efficiency and reduction in footprint, breakthrough in design of light-emitting elements needs to be achieved. Now, as an embodiment of a light-emitting element that achieves the breakthrough, some examples of a light-emitting element according to a seventh embodiment are described.

7.2) Light-Emitting Element According to Embodiment 7A

Figure 17A:
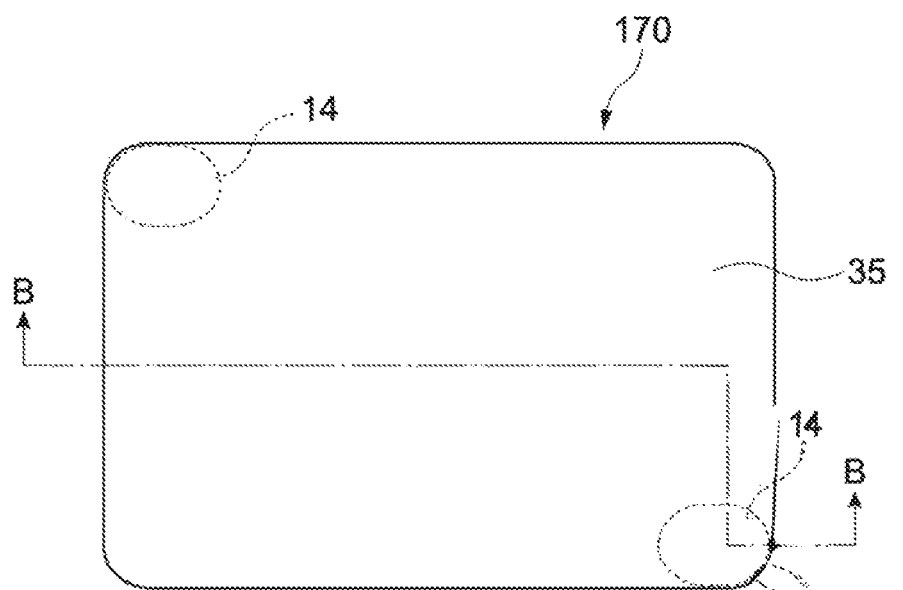
FIG. 17A is a plan view of a light-emitting element according to Embodiment 7A of the present technology.
Figure 17B:
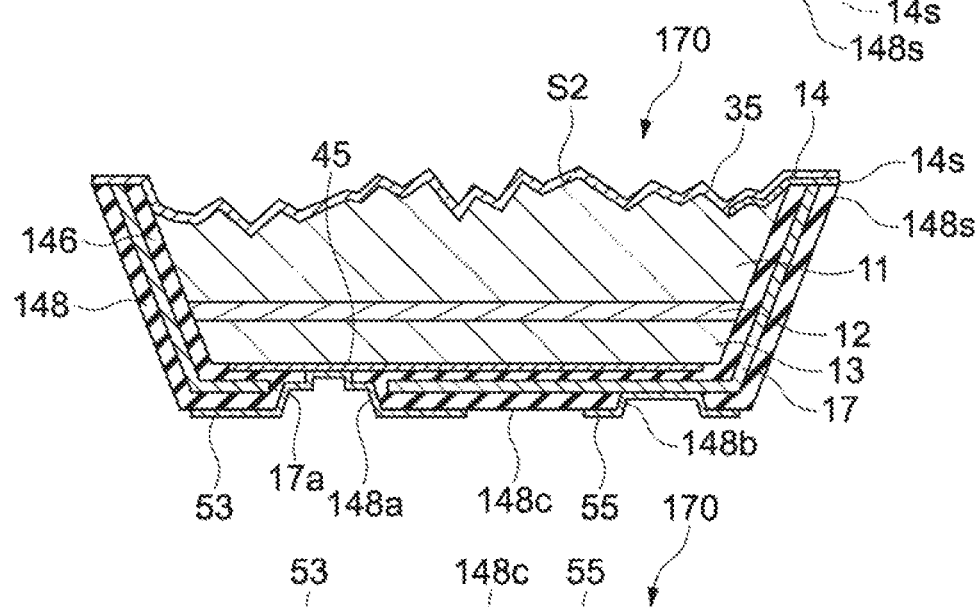
FIGS. 17B and 17C are respectively a cross-sectional view and a bottom view of the light-emitting element.
Figure 17C:
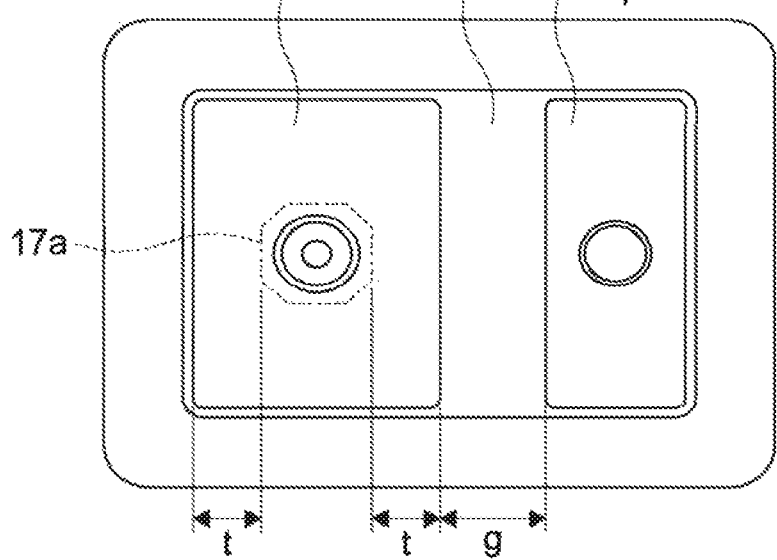

FIG. 17A is a plan view of a light-emitting element according to Embodiment 7A of the present technology. FIGS. 17B and 17C are respectively a cross-sectional view and a bottom view of the light-emitting element 170. Note that, the light-emitting surface S2 of the semiconductor layer of the light-emitting element 170 has random or regular protrusions and recesses such that the light-emitting efficiency is increased. As a matter of course, the light-emitting surface S2 may be flat as in Embodiments described hereinabove. Light-emitting surfaces of light-emitting elements according to Embodiments described hereinbelow may also be flat.

The light-emitting element 170 includes the first-conductivity-type layer 11 on the light-emitting surface S2 side. The first electrode 14 in contact with the metal layer 17 is connected to the first-conductivity-type layer 11. As illustrated in FIG. 17A, the first electrodes 14 are arranged, for example, at two diagonal rounded corner portions of four rounded corner portions of the light-emitting element 170 having a schematically rectangular shape in plan view.

The first electrode 14 may be provided alone, or may include a plurality of first electrodes 14 in forms other than that illustrated in FIG. 17A. Alternatively, as long as a desired intensity of light to be emitted can be secured, the first electrode 14 may be arranged substantially over an entirety of an outer peripheral portion of the first-conductivity-type layer 11.

Further, the first electrode 14 is connected, through intermediation of the metal layer 17, to a third electrode (third electrode portion) 55 arranged at a bottom portion of the light-emitting element 170. In other words, the third electrode 55 is connected to the metal layer 17, and functions as a pad electrode for external connection.

As illustrated in FIG. 17B, a second insulating layer 148 has a first opening 148a facing the opening 17a of the metal layer 17, and a second opening 148b. The third electrode 55 is arranged in the second opening 148b. A second electrode portion (or pad electrode 53 as a part thereof) is arranged on the second insulating layer 148 so as to be in contact with the second-conductivity-type layer 13 through the opening 17a of the metal layer 17 and the first opening 148a, and is insulated from the metal layer 17. The second electrode portion includes the second electrode 45 and the pad electrode 53. The pad electrode 53 and the third electrode 55 are configured such that respective parts of the pad electrode 53 and the third electrode 55 are located in a common plane on the second insulating layer 148, specifically, located on a bottom surface 148c.

In this way, the light-emitting element 170 includes the first electrode 14 connected to the first-conductivity-type layer 11 and the metal layer 17, and the third electrode 55 arranged at the bottom portion so as to be connected to the metal layer 17. With such a configuration, the light-emitting element 170 can be flip-chip mounted to a substrate. Thus, an area of the first electrode 14 can be reduced to a requisite minimum as long as the open state is not reached, and hence the efficiency in emitting light through the light-emitting surface S2 can be increased.

Further, in the light-emitting element 170, unlike the light-emitting element 80 according to Comparative Example 7 illustrated in FIG. 16B, the area of the active layer 12 need not be reduced. In other words, in this embodiment, even within a small footprint, it is possible to secure a desired area of the active layer 14, and in accordance therewith, secure an intensity of light to be emitted.

As described in Comparative Example 7 with reference to FIG. 16C, the pad electrode 152 (153) and the opening 17a (17b) of the metal layer 17 need to be accurately overlapped with each other. In contrast, in this embodiment, there are no problems as long as overlapping accuracy between the pad electrode 53 of the second electrode portion and the opening 17a is secured, and as long as the third electrode 55 on another side is conducted to the metal layer 17. Thus, an area of the third electrode 55 can be reduced to a requisite minimum, and hence an area of the pad electrode 53 can be set larger. With this, as illustrated in FIG. 17C, a gap between the pad electrode 53 and the third electrode 55 is sufficiently secured, and requirements for the overlapping accuracy between the pad electrode 53 and the opening 17a are relaxed. As a result, a degree of freedom in laying out the two electrodes 53 and 55 at the bottom portion of the light-emitting element 170 is increased.

A transparent protective layer 35 is formed on the first-conductivity-type layer 11. The first electrode 14 is covered with the protective layer 35, and has an exposed side surface 14s. A contour of the exposed side surface 14s of the first electrode 14 conforms to a contour of a part (corner portion) of an outer-peripheral side surface 148s of the second insulating layer 148 (side surface of the light-emitting element 170). With this, at the time of manufacturing the light-emitting element 170, etching before separating light-emitting elements into pieces can be finished only once with use of the same mask as that configured to separate light-emitting elements into pieces. As a result, a manufacturing step is simplified.

Further, as in Embodiments described hereinabove, the problem of the ion migration can be solved.

7.3) Light-Emitting Element According to Embodiment 7B

Figure 18A:
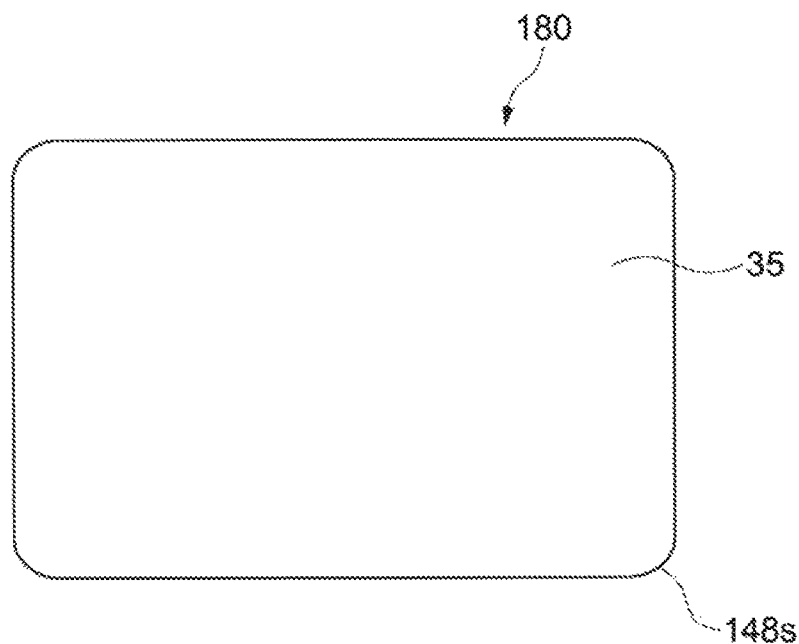
FIG. 18A is a plan view of a light-emitting element according to Embodiment 7B of the present technology.
Figure 18B:
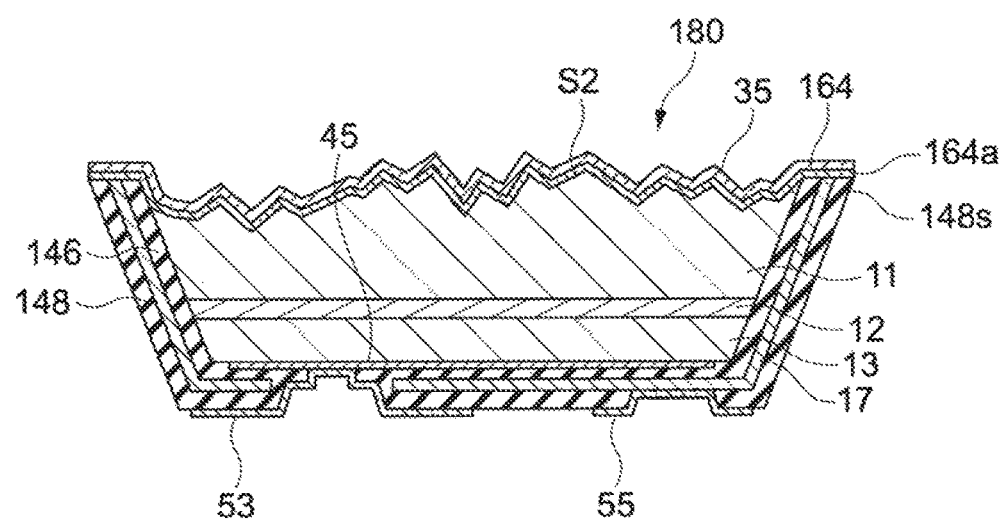
FIG. 18B is a bottom view of the light-emitting element.

FIG. 18A is a plan view of a light-emitting element according to Embodiment 7B of the present technology. FIG. 18B is a bottom view of the light-emitting element 180. In the following description, components, functions, and the like, which are substantially the same as those of the light-emitting element 170 according to Embodiment 7A described above, are denoted by the same reference symbols to simplify or omit redundant description thereof, and differences are mainly described.

The light-emitting element 180 includes a transparent electrode 164 that is arranged on the light-emitting surface S2 and serves as the first electrode. The transparent electrode 164 is connected to the third electrode 55 at the bottom portion through intermediation of the metal layer 17. The transparent electrode 164 is covered with the protective layer 35 except an exposed side surface 164a thereof. The exposed side surface 164a conforms to the contour of the part of the outer-peripheral side surface 148s of the second insulating layer 148. With this, as in Embodiment 7A described above, the step of manufacturing light-emitting elements is simplified.

The light-emitting element 180 according to Embodiment 7B configured as described above also achieves high light-emitting efficiency and reduction in footprint.

7.4) Light-Emitting Element According to Embodiment 7C

Figure 19A:
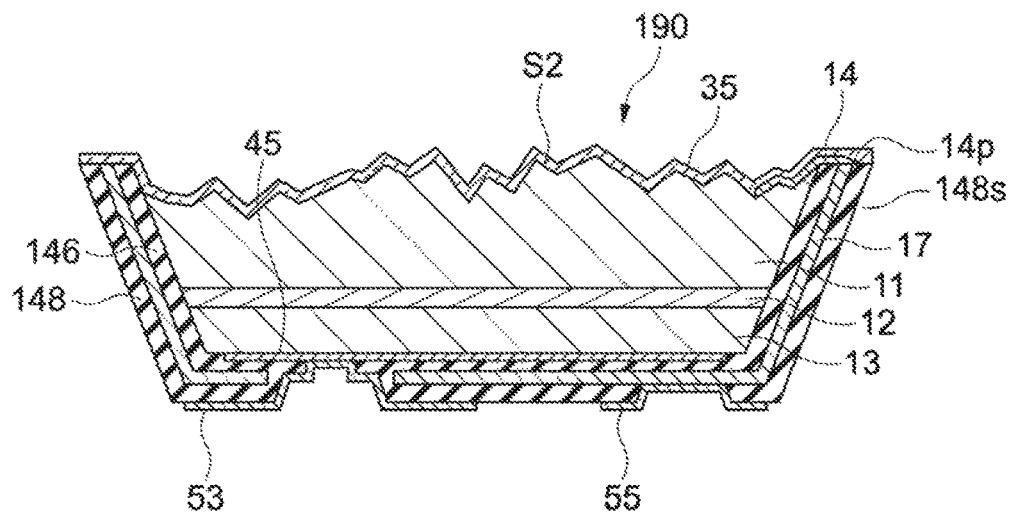
FIG. 19A is a cross-sectional view of a light-emitting element according to Embodiment 7C of the present technology.

FIG. 19A is a cross-sectional view of a light-emitting element according to Embodiment 7C of the present technology. An outer peripheral portion 14p of the first electrode 14 of the light-emitting element 190 is arranged on an inner side with respect to the outer-peripheral side surface 148s of the second insulating layer 148, covered with the protective layer 35, and is not exposed to an outside.

With such a configuration, even when the first electrode 14 is made of a corrosion-prone material, corrosion thereof can be suppressed. Further, when a method that uses plating growth (plating joining) is utilized as a method for connecting the pad electrode 53 and the third electrode 55 to a substrate, surplus of the plating can be prevented from growing from the first electrode 14 or the metal layer 17 onto an upper surface or side surfaces of the light-emitting element 190.

7.5) Light-Emitting Element According to Embodiment 7D

Figure 19B:
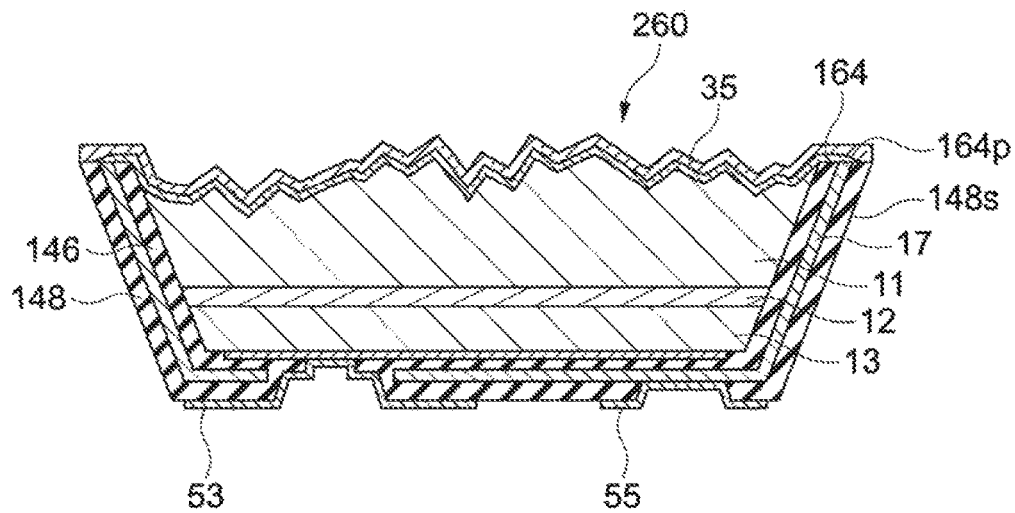
FIG. 19B is a cross-sectional view of a light-emitting element according to Embodiment 7D of the present technology.

FIG. 19B is a cross-sectional view of a light-emitting element according to Embodiment 7D of the present technology. As in Embodiment 7B (refer to FIGS. 18A and 18B), the light-emitting element 260 includes the transparent electrode 164 as a first electrode thereof. As in Embodiment 7C described above, an outer peripheral portion 164p of the transparent electrode 164 is arranged on the inner side with respect to the outer-peripheral side surface 148s of the second insulating layer 148, and covered with the protective layer 35.

7.6) Light-Emitting Elements According to Embodiments 7E and 7E'

Figure 20A:
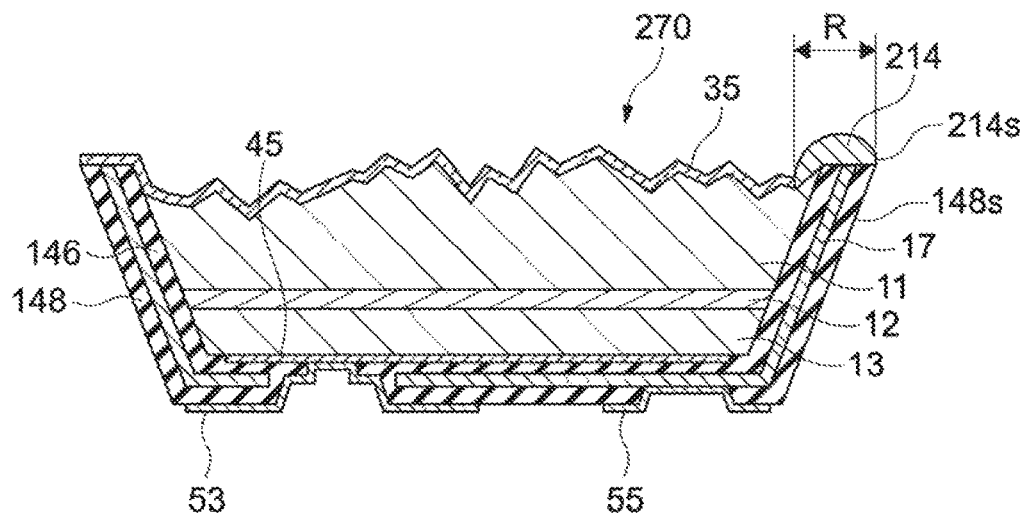
FIG. 20A is a cross-sectional view of a light-emitting element according to Embodiment 7E of the present technology.

FIG. 20A is a cross-sectional view of a light-emitting element according to Embodiment 7E of the present technology. In the light-emitting element 270, the protective layer 35 is formed on the first-conductivity-type layer 11 in a manner that an uncovered region R in which respective parts of the metal layer 17 and the first-conductivity-type layer 11 are not continuously covered is formed. A first electrode portion 214 is arranged in the uncovered region R of the protective layer 35.

For example, when the second electrode portion (pad electrode 53) and the third electrode 55 are joined by plating growth to a terminal electrode on a substrate, simultaneously with this plating joining, the first electrode portion 214 can be formed by plating growth from the metal layer 17. With this, the step of manufacturing light-emitting elements can be simplified, and manufacturing cost can be reduced. Note that, in this embodiment, there are no problems as long as the plating joining is performed, for example, after the protective layer 35 including the uncovered region R is formed by photolithography and etching.

Figure 20B:
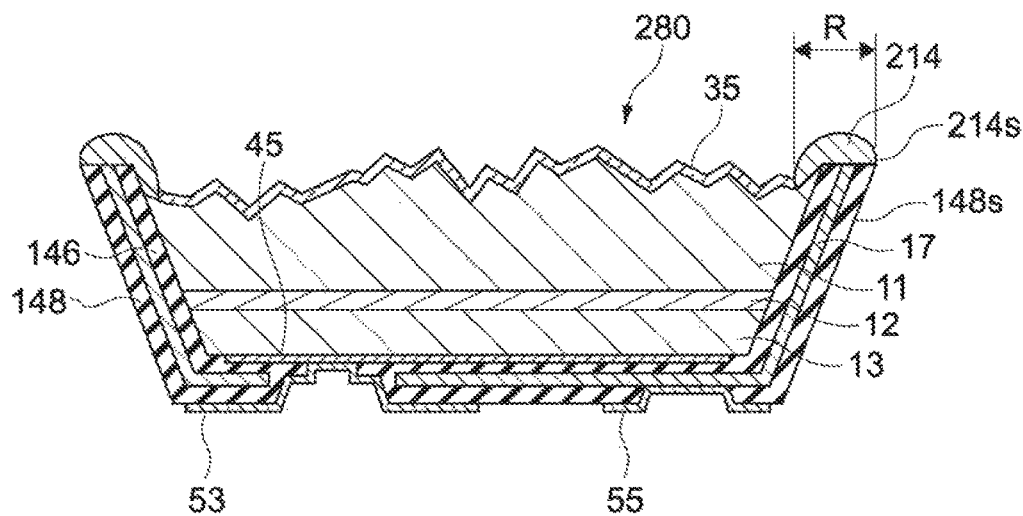
FIG. 20B is a cross-sectional view illustrating a modification of a light-emitting element according to Embodiment 7E' of the present technology.

Alternatively, as in a light-emitting element 280 according to Embodiment 7E' illustrated in FIG. 20B, the plating joining may be performed first such that the first electrode portion 214 is formed before the protective layer 35 is formed. In this case, the first electrode portion 214 may be formed substantially over the entirety of the outer peripheral portion of the first-conductivity-type layer 11, and need not necessarily be formed over the entirety as a matter of course.

As in the above description of Embodiment 7A, the first electrode portion 214 of each of the light-emitting elements according to Embodiments 7E and 7E' may have an exposed side surface 214s, and a contour of the side surface 214s may conform to the contour of the part of the outer-peripheral side surface 148s of the second insulating layer 148.

Note that, similar to the light-emitting surfaces S2 of Embodiments 7A to 7E' described hereinabove, the light-emitting surfaces S2 of further preceding Embodiments 1 to 6 may each have random or regular protrusions and recesses.

8. Other Embodiments

The present technology is not limited to Embodiments described hereinabove, and may be carried out in other various embodiments.

For example, the above-described light-emitting unit includes the three light-emitting elements corresponding to the light-emitting wavelength bands different from each other, but there are no problems as long as one or more light-emitting elements are arranged.

At least two of the features of Embodiments described hereinabove may be combined with each other.

Note that, the present technology may also employ the following configurations.

(1)

A light-emitting element, including:
a semiconductor layer including
an active layer,
a first-conductivity-type layer, and
a second-conductivity-type layer, the semiconductor layer having a semiconductor-layer side surface including
a side surface of the active layer,
a side surface of the first-conductivity-type layer, and
a side surface of the second-conductivity-type layer;
a first electrode portion connected to the first-conductivity-type layer;
a second electrode portion connected to the second-conductivity-type layer;
a first insulating layer in contact at least with a part of the semiconductor-layer side surface, the part of the semiconductor-layer side surface corresponding to a part of the side surface of the active layer; and
a metal layer in contact at least with an opposed surface of the first insulating layer, the opposed surface of the first insulating layer facing the side surface of the active layer, the metal layer being conducted to the first electrode portion and insulated from the second electrode portion.

(2)

The light-emitting element according to Item (1), in which the first insulating layer and the metal layer have a laminated structure, and cover an entirety of the semiconductor-layer side surface.

(3)

The light-emitting element according to Item (1) or (2), in which the second-conductivity-type layer has
a first surface which is in contact with the active layer, and
a second surface which is on an opposite side with respect to the first surface, and to which the second electrode portion is connected, the second surface serving as a light-emitting surface.

(4)

The light-emitting element according to Item (3), in which
the first electrode portion includes a first connecting-conductive portion that can be connected to a substrate, the light-emitting element being mounted to the substrate, and
the metal layer is connected to the first connecting-conductive portion.

(5)

The light-emitting element according to Item (4), in which
the second electrode portion includes a second connecting-conductive portion formed through the first insulating layer, and
the metal layer is connected to the second connecting-conductive portion.

(6)

The light-emitting element according to Item (1) or (2), in which the first-conductivity-type layer has
a first surface which is in contact with the active layer, and
a second surface which is on an opposite side with respect to the first surface, and to which the first electrode portion is connected, the second surface serving as a light-emitting surface.

(7)

The light-emitting element according to Item (6), in which the first electrode portion is connected to the metal layer across an end surface on the light-emitting surface side of the first insulating layer.

(8)

The light-emitting element according to Item (6), in which
the first electrode portion includes a connecting-conductive portion formed through the first insulating layer, and
the metal layer is connected to the connecting-conductive portion.

(9)

The light-emitting element according to any one of Items (1) to (8), further including a second insulating layer formed such that the metal layer is arranged between the first insulating layer and the second insulating layer.

(10)

The light-emitting element according to Item (1), in which
the first-conductivity-type layer is a p-type semiconductor layer, and
the second-conductivity-type layer is an n-type semiconductor layer.

(11)

The light-emitting element according to Item (1), in which
the first-conductivity-type layer is an n-type semiconductor layer, and
the second-conductivity-type layer is a p-type semiconductor layer.

(12)

The light-emitting element according to Item (6), further including a third electrode portion for external connection, the third electrode portion being connected to the metal layer.

(13)

The light-emitting element according to Item (12), further including a second insulating layer formed such that the metal layer is arranged between the first insulating layer and the second insulating layer, in which
the metal layer has an opening,
the second insulating layer has
a first opening facing the opening of the metal layer, and
a second opening,
the second electrode portion is arranged on the second insulating layer so as to be in contact with the second-conductivity-type layer through the opening of the metal layer and the first opening, and
the third electrode portion is arranged on the second insulating layer so as to be in contact with the metal layer through the second opening.

(14)

The light-emitting element according to Item (13), in which the second electrode portion and the third electrode portion are configured such that a part of the second electrode portion and a part of the third electrode portion are located in a common plane on the second insulating layer.

(15)
The light-emitting element according to any one of Items (12) to (14), in which the first electrode portion includes a transparent electrode.

(16)
The light-emitting element according to any one of Items (12) to (15), in which
the second insulating layer has an outer-peripheral side surface forming a side surface of the light-emitting element,
the first electrode portion has an exposed side surface, and
a contour of the exposed side surface conforms to a contour of a part of the outer-peripheral side surface of the second insulating layer.

(17)
The light-emitting element according to any one of Items (12) to (15), further including a protective layer that covers the first-conductivity-type layer, in which
the second insulating layer has an outer-peripheral side surface forming a side surface of the light-emitting element, and
an outer peripheral portion of the first electrode portion is arranged on an inner side with respect to the outer-peripheral side surface of the second insulating layer, and covered with the protective layer.

(18)
The light-emitting element according to Item (12), further including a protective layer including an uncovered region in which a part of the metal layer and a part of the first-conductivity-type layer are not continuously covered, the protective layer being formed on the first-conductivity-type layer,
in which the first electrode portion is arranged in the uncovered region of the protective layer.

(19)
A light-emitting unit, including:
a substrate including a wire;
a light-emitting element; and
a joint portion that joins the light-emitting element to the wire on the substrate, the light-emitting element including
a semiconductor layer including
an active layer,
a first-conductivity-type layer, and
a second-conductivity-type layer, the semiconductor layer having a semiconductor-layer side surface including
a side surface of the active layer,
a side surface of the first-conductivity-type layer, and
a side surface of the second-conductivity-type layer,
a first electrode portion connected to the first-conductivity-type layer,
a second electrode portion connected to the second-conductivity-type layer,
a first insulating layer in contact at least with a part of the semiconductor-layer side surface, the part of the semiconductor-layer side surface corresponding to a part of the side surface of the active layer, and
a metal layer in contact with an opposed surface of the first insulating layer, the opposed surface of the first insulating layer facing the side surface of the active layer, the metal layer being conducted to the first electrode portion and insulated from the second electrode portion.

(20)
The light-emitting unit according to Item (19), in which the joint portion or the wire is made of silver, copper, lead, tin, gold, nickel, palladium, or an alloy of at least two of these metals.

(21)
A light-emitting panel device, including:
a light-emitting panel including a plurality of light-emitting elements; and
a drive circuit that drives the plurality of light-emitting elements, the plurality of light-emitting elements including at least one light-emitting element including
a semiconductor layer including
an active layer,
a first-conductivity-type layer, and
a second-conductivity-type layer, the semiconductor layer having a semiconductor-layer side surface including
a side surface of the active layer,
a side surface of the first-conductivity-type layer, and
a side surface of the second-conductivity-type layer,
a first electrode portion connected to the first-conductivity-type layer,
a second electrode portion connected to the second-conductivity-type layer,
a first insulating layer in contact at least with a part of the semiconductor-layer side surface, the part of the semiconductor-layer side surface corresponding to a part of the side surface of the active layer, and
a metal layer in contact with an opposed surface of the first insulating layer, the opposed surface of the first insulating layer facing the side surface of the active layer, the metal layer being conducted to the first electrode portion and insulated from the second electrode portion.

(22)
The light-emitting panel device according to Item (21), further including a substrate, the plurality of light-emitting elements being arranged in matrix on the substrate.

(23)
The light-emitting panel device according to Item (21) or (22), in which
the first-conductivity-type layer is a p-type semiconductor layer, and
the drive circuit is configured to apply a positive voltage to the first electrode portion to cause the light-emitting elements to emit light.

(24)
The light-emitting panel device according to Item (21), in which
the drive circuit is configured to control timings of applying a positive voltage such that the positive voltage is applied alternately to the first electrode portion and the second electrode portion, and that a period for applying the positive voltage to the first electrode portion is longer than a period for applying the positive voltage to the second electrode portion.

(25)
The light-emitting panel device according to Item (24), in which
the first-conductivity-type layer is an n-type semiconductor layer, the second-conductivity-type layer is a p-type semiconductor layer, and the drive circuit is configured to apply the positive voltage to a first electrode during a non-light-emission period, and to apply the positive voltage to a second electrode during a light-emission period.

(26)

A method for driving a light-emitting panel device, the light-emitting panel device including a light-emitting panel including a plurality of light-emitting elements, and a drive circuit that drives the plurality of light-emitting elements, the plurality of light-emitting elements including at least one light-emitting element including a semiconductor layer including
an active layer,
a first-conductivity-type layer, and
a second-conductivity-type layer, the semiconductor layer having a semiconductor-layer side surface including
a side surface of the active layer,
a side surface of the first-conductivity-type layer, and
a side surface of the second-conductivity-type layer, a first electrode portion connected to the first-conductivity-type layer, a second electrode portion connected to the second-conductivity-type layer, a first insulating layer in contact at least with a part of the semiconductor-layer side surface, the part of the semiconductor-layer side surface corresponding to a part of the side surface of the active layer, and a metal layer in contact with an opposed surface of the first insulating layer, the opposed surface of the first insulating layer facing the side surface of the active layer, the metal layer being conducted to the first electrode portion and insulated from the second electrode portion, the method for driving a light-emitting panel device including causing the drive circuit to:

apply a positive voltage to the first electrode portion;

apply the positive voltage to the second electrode portion; and control timings of applying the voltage such that the voltage is applied alternately to the first electrode portion and the second electrode, and that a period for applying the voltage to the first electrode portion is longer than a period for applying the voltage to the second electrode portion.

(27)

The method for driving a light-emitting panel device according to Item (26), in which the light-emitting panel includes a substrate, the plurality of light-emitting elements being arranged in matrix on the substrate, the first-conductivity-type layer is an n-type semiconductor layer, the second-conductivity-type layer is a p-type semiconductor layer, and the method for driving a light-emitting panel device includes causing the drive circuit to apply the positive voltage to the first electrode portion during a non-light-emission period, and to apply the positive voltage to the second electrode portion during a light-emission period.

REFERENCE SIGNS LIST 1 light-emitting unit
3 display device (light-emitting panel device)
10 (10R, 10G, 10B), 60, 110, 160, 170, 180, 190, 260, 270, 280 light-emitting element
11, 41 first-conductivity-type layer
12, 42 active layer
13, 43 second-conductivity-type layer
14, 24, 44, 164, 214 first electrode
15, 45 second electrode
16, 26, 46 first insulating layer
17, 27, 47, 117, 247 metal layer
18, 28, 48 second insulating layer
19, 52, 53 pad electrode
29 conductive film
34 connecting portion
35 protective layer
51 bump
55 third electrode
100, 200, 320 substrate
101, 201, 202 wire
102, 203, 204 joint portion
310 display panel (light-emitting panel)
S1 semiconductor-layer side surface
S2 light-emitting surface

The invention claimed is:

1. A light-emitting element, comprising:
a semiconductor layer including:
an active layer;
a first-conductivity-type layer, the first-conductivity-type layer includes:
a first surface in contact with the active layer; and
a second surface opposite to the first surface; and
a second-conductivity-type layer, wherein a semiconductor-layer side surface of the semiconductor layer includes:
a side surface of the active layer,
a side surface of the first-conductivity-type layer, and
a side surface of the second-conductivity-type layer, wherein each of the side surface of the active layer, the side surface of the first-conductivity-type layer, and the side surface of the second-conductivity-type layer is inclined with respect to a laminating direction of the semiconductor layer;
a first electrode portion, wherein a part of the first electrode portion is in contact with the first-conductivity-type layer;
a second electrode portion connected to the second-conductivity-type layer;
a protective layer that covers the second surface of the first-conductivity-type layer, wherein
the first electrode portion is in an uncovered region of the protective layer,
and
the first electrode portion comprises an exposed surface;
a first insulating layer in contact with the semiconductor-layer side surface, wherein an entirety of the semiconductor-layer side surface is covered by the first insulating layer;
a metal layer in contact with at least with a first surface of the first insulating layer, wherein the first surface of the first insulating layer is opposite to a second surface of the first insulating layer that faces the side surface of the active layer; and a pad electrode in contact with the second electrode portion.

2. The light-emitting element according to claim 1, wherein the first insulating layer, the pad electrode, and the metal layer have a laminated structure.

3. The light-emitting element according to claim 1, wherein the second-conductivity-type layer includes:
a first surface in contact with the active layer; and
a second surface opposite to the first surface, the second surface is connected to the second electrode portion.

4. The light-emitting element according to claim 3, wherein
the first electrode portion includes a connecting-conductive portion that is connected to a substrate,
the light-emitting element is flip-chip mounted to the substrate, and
the metal layer is connected to the connecting-conductive portion.

5. The light-emitting element according to claim 1, wherein
the second surface the first-conductivity-type layer is connected to the first electrode portion, and
the second surface is configured to serve as a light-emitting surface.

6. The light-emitting element according to claim 5, wherein
the first electrode portion includes a connecting-conductive portion that extends through the first insulating layer, and
the metal layer is connected to the connecting-conductive portion.

7. The light-emitting element according to claim 1, further comprising a second insulating layer, wherein the metal layer is between the first insulating layer and the second insulating layer.

8. The light-emitting element according to claim 1, wherein
the first-conductivity-type layer is a p-type semiconductor layer, and
the second-conductivity-type layer is an n-type semiconductor layer.

9. The light-emitting element according to claim 1, wherein
the first-conductivity-type layer is an n-type semiconductor layer, and
the second-conductivity-type layer is a p-type semiconductor layer.

10. The light-emitting element according to claim 1, further comprising a third electrode portion for external connection, wherein the third electrode portion is connected to the metal layer.

11. The light-emitting element according to claim 10, further comprising a second insulating layer, wherein the metal layer is between the first insulating layer and the second insulating layer, wherein
the second insulating layer comprises:
a first opening that faces an opening of the metal layer; and
a second opening,
the second electrode portion is on the second insulating layer,
the second electrode portion is in contact with the second-conductivity-type layer through the opening of the metal layer and the first opening,
the third electrode portion is on the second insulating layer, and
the third electrode portion is in contact with the metal layer through the second opening.

12. The light-emitting element according to claim 11, wherein a part of the second electrode portion and a part of the third electrode portion are at a common plane with the second insulating layer.

13. The light-emitting element according to claim 11, wherein
the second insulating layer has an outer-peripheral side surface that corresponds to a side surface of the light-emitting element,
the first electrode portion has an exposed side surface, and
a contour of the exposed side surface conforms to a contour of a part of the outer-peripheral side surface of the second insulating layer.

14. The light-emitting element according to claim 11, wherein
the second insulating layer has an outer-peripheral side surface that corresponds to a side surface of the light-emitting element, and
an outer peripheral portion of the first electrode portion is on an inner side with respect to the outer-peripheral side surface of the second insulating layer, and covered with the protective layer.

15. The light-emitting element according to claim 1, wherein the first electrode portion includes a transparent electrode.

16. The light-emitting element according to claim 1, wherein
a part of the metal layer and a part of the first-conductivity-type layer are not covered continuously in the uncovered region of the protective layer.

17. The light-emitting element according to claim 1, wherein the metal layer is insulated from the second electrode portion.

18. A light-emitting unit, comprising:
a substrate including a wire;
a light-emitting element; and
a joint portion that joins the light-emitting element to the wire on the substrate,
wherein the light-emitting element includes:
a semiconductor layer, including:
an active layer;
a first-conductivity-type layer, the first-conductivity-type layer includes:
a first surface in contact with the active layer; and
a second surface opposite to the first surface; and
a second-conductivity-type layer,
wherein a semiconductor-layer side surface of the semiconductor layer includes:
a side surface of the active layer,
a side surface of the first-conductivity-type layer, and
a side surface of the second-conductivity-type layer, wherein each of the side surface of the active layer, the side surface of the first-conductivity-type layer, and the side surface of the second-conductivity-type layer is inclined with respect to a laminating direction of the semiconductor layer;
a first electrode portion, wherein a part of the first electrode portion is in contact with the first-conductivity-type layer;
a second electrode portion connected to the second-conductivity-type layer;
a protective layer that covers the second surface of the first-conductivity-type layer, wherein the first electrode portion is in an uncovered region of the protective layer, and the first electrode portion comprises an exposed surface;

a first insulating layer in contact with the semiconductor-layer side surface, wherein an entirety of the semiconductor-layer side surface is covered by the first insulating layer;

a metal layer in contact with at least with a first surface of the first insulating layer, wherein the first surface of the first insulating layer is opposite to a second surface of the first insulating layer that faces the side surface of the active layer, and the metal layer is insulated from the second electrode portion; and a pad electrode in contact with the second electrode portion.

19. The light-emitting unit according to claim 18, wherein at least one of the joint portion or the wire comprises one of silver, copper, lead, tin, gold, nickel, palladium, or an alloy including at least two of silver, copper, lead, tin, gold, nickel, or palladium.

20. A light-emitting panel device, comprising:

a substrate;

a light-emitting panel including a plurality of light-emitting elements, wherein the plurality of light-emitting elements is in a matrix on the substrate; and a drive circuit configured to drive the plurality of light-emitting elements, wherein at least one of the plurality of light-emitting elements includes:

a semiconductor layer, including:

an active layer;

a first-conductivity-type layer; and a second-conductivity-type layer, wherein a semiconductor-layer side surface of the semiconductor layer includes:

a side surface of the active layer, a side surface of the first-conductivity-type layer, and a side surface of the second-conductivity-type layer, wherein each of the side surface of the active layer, the side surface of the first-conductivity-type layer, and the side surface of the second-conductivity-type layer is inclined with respect to a laminating direction of the semiconductor layer;

a first electrode portion connected to the first-conductivity-type layer;

a second electrode portion connected to the second-conductivity-type layer, wherein the drive circuit is further configured to control timings of application of a positive voltage such that the positive voltage is applied alternately to the first electrode portion and the second electrode portion, and a first period for application of the positive voltage to the first electrode portion is longer than a second period for application of the positive voltage to the second electrode portion;

a first insulating layer in contact with the semiconductor-layer side surface, wherein an entirety of the semiconductor-layer side surface is covered by the first insulating layer;

a metal layer in contact with at least with a first surface of the first insulating layer, wherein the first surface of the first insulating layer is opposite to a second surface of the first insulating layer that faces the side surface of the active layer, and the metal layer is insulated from the second electrode portion; and a pad electrode in contact with the second electrode portion.

21. The light-emitting panel device according to claim 20, wherein the first-conductivity-type layer is a p-type semiconductor layer, and the drive circuit is further configured to apply the positive voltage to the first electrode portion which causes the plurality of light-emitting elements to emit light.

22. The light-emitting panel device according to claim 20, wherein the first-conductivity-type layer is an n-type semiconductor layer, the second-conductivity-type layer is a p-type semiconductor layer, and the drive circuit is further configured to apply the positive voltage to the first electrode portion during a non-light-emission period, and to apply the positive voltage to the second electrode portion during a light-emission period.

23. A method for driving a light-emitting panel device, comprising:

in the light-emitting panel device that includes a light-emitting panel including a plurality of light-emitting elements, and a drive circuit configured to drive the plurality of light-emitting elements, wherein at least one of the plurality of light-emitting elements includes a semiconductor layer including an active layer, a first-conductivity-type layer, and a second-conductivity-type layer, wherein a semiconductor-layer side surface of the semiconductor layer includes:

a side surface of the active layer, a side surface of the first-conductivity-type layer, and a side surface of the second-conductivity-type layer, a first electrode portion connected to the first-conductivity-type layer, a second electrode portion connected to the second-conductivity-type layer, a first insulating layer in contact with the semiconductor-layer side surface, wherein an entirety of the semiconductor-layer side surface is covered by the first insulating layer, and a metal layer in contact at least with a first surface of the first insulating layer, wherein the first surface of the first insulating layer is opposite to a second surface of the first insulating layer that faces the side surface of the active layer, and the metal layer is conducted to the first electrode portion and insulated from the second electrode portion:

applying, by the drive circuit, a positive voltage to the first electrode portion;

applying, by the drive circuit, the positive voltage to the second electrode portion; and controlling, by the drive circuit, timings of applying the positive voltage such that the positive voltage is applied alternately to the first electrode portion and the second electrode portion, and a first period for applying the positive voltage to the first electrode portion is longer than a second period for applying the positive voltage to the second electrode portion.

24. The method for driving the light-emitting panel device according to claim 23, further comprising:

applying, by the drive circuit, the positive voltage to the first electrode portion during a non-light-emission period; and applying, by the drive circuit, the positive voltage to the second electrode portion during a light-emission period, wherein the light-emitting panel includes a substrate, the plurality of light-emitting elements is arranged in a matrix on the substrate, the first-conductivity-type layer is an n-type semiconductor layer, and the second-conductivity-type layer is a p-type semiconductor layer.

* * * * *